(12) United States Patent  
Kobayashi

(10) Patent No.: US 7,760,567 B2
(45) Date of Patent: Jul. 20, 2010

(54) SEMICONDUCTOR MEMORY AND SYSTEM

(75) Inventor: Hiroyuki Kobayashi, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 12/234,181

(22) Filed: Sep. 19, 2008

(65) Prior Publication Data

US 2009/0016133 A1     Jan. 15, 2009

Related U.S. Application Data

(63) Continuation of application No. PCT/JP2006/306308, filed on Mar. 28, 2006.

(51) Int. Cl.
*G11C 7/00* (2006.01)

(52) U.S. Cl. .................. 365/203; 365/205; 365/207; 365/189.05; 365/230.06; 365/227; 365/229

(58) Field of Classification Search .......... 365/203, 365/205, 207, 189.05, 230.06, 227, 229
See application file for complete search history.

(56) References Cited

U.S. PATENT DOCUMENTS

| 5,014,246 | A | * | 5/1991 | Komatsu et al. | ....... 365/230.03 |
| 5,303,196 | A | * | 4/1994 | Sang et al. | ................ 365/206 |
| 5,995,431 | A | * | 11/1999 | Inui et al. | ................ 365/203 |
| 6,091,653 | A | * | 7/2000 | Wang et al. | .............. 365/203 |
| 6,147,916 | A | * | 11/2000 | Ogura | .................... 365/203 |

FOREIGN PATENT DOCUMENTS

| JP | 04-030388 A | 2/1992 |
| JP | H09-147559 A | 6/1997 |
| JP | 2000-090668 A | 3/2000 |
| JP | 2000-195270 A | 7/2000 |
| JP | 2002-025268 A | 1/2002 |
| JP | 2002-208276 A | 7/2002 |
| JP | 2003-281892 A | 10/2003 |
| JP | 2004-220752 A | 8/2004 |

* cited by examiner

*Primary Examiner*—Anh Phung
*Assistant Examiner*—Eric Wendler
(74) *Attorney, Agent, or Firm*—Arent Fox LLP

(57) ABSTRACT

A first precharge circuit couples a bit line pair to a precharge voltage line in a standby period, and separates at least an access side of the bit line pair from the precharge voltage line in accordance with operation start of a word line driving circuit. A sense amplifier amplifies a voltage difference of a node pair after the operation start of the word line driving circuit. A switch circuit is provided between the bit line pair and the node pair. The switch circuit has coupled the access side of the bit line pair to an access side of the node pair at an instant of the operation start of the word line driving circuit, and has separated a non-access side of the bit line pair from a non-access side of the node pair at an instant of operation start of the sense amplifier.

20 Claims, 22 Drawing Sheets

SEMICONDUCTOR MEMORY AND SYSTEM

CROSS-REFERENCE TO RELATED APPLICATION

This application is a Continuation application of International Application No. PCT/JP2006/306308, filed Mar. 28, 2006, designating the U.S., the entire contents of which are incorporated herein by reference.

BACKGROUND

1. Field

The present embodiment relates to a semiconductor memory and a system using a semiconductor memory.

2. Description of the Related Art

In recent years, portable electronic devices (mobile phones, digital cameras, and so on) driven by using a battery have come into wide use. Low power consumption is strongly required of a semiconductor memory used in a system of a portable electronic device in order to enable long-term use of the battery. Japanese Laid-open Patent Publication No. H09-147559 discloses a sense amplifier that amplifies a signal read to one of a bit line pair from a memory cell selected by a word line selection operation, by using precharge voltage of the other of the bit line pair as reference voltage.

Japanese Laid-open Patent Publication No. H09-147559 discloses that, where the amplification operation of the sense amplifier is divided into two stages, the bit line used for obtaining the reference voltage in the bit line pair is separated from the sense amplifier in synchronization with the start of the second-stage amplification operation.

SUMMARY

According to an aspect of the embodiment, a semiconductor memory includes a plurality of memory cells, a word line driving circuit, a first precharge circuit, a sense amplifier, and a switch circuit. The plural memory cells are provided at positions where a plurality of word lines and a bit line pair intersect with each other, respectively. The word line driving circuit activates one of the plural word lines in accordance with transition from a standby period to an active period. The first precharge circuit couples the bit line pair to a precharge voltage line in the standby period, and separates at least an access side of the bit line pair from the precharge voltage line in accordance with operation start of the word line driving circuit. The sense amplifier amplifies a voltage difference of a node pair corresponding to the bit line pair after the operation start of the word line driving circuit. The switch circuit is provided between the bit line pair and the node pair. The switch circuit has coupled the access side of the bit line pair to an access side of the node pair at a timing of the operation start of the word line driving circuit, and has separated a non-access side of the bit line pair from a non-access side of the node pair at a timing of operation start of the sense amplifier.

DETAILED DESCRIPTION OF THE EMBODIMENTS

Figure 1:
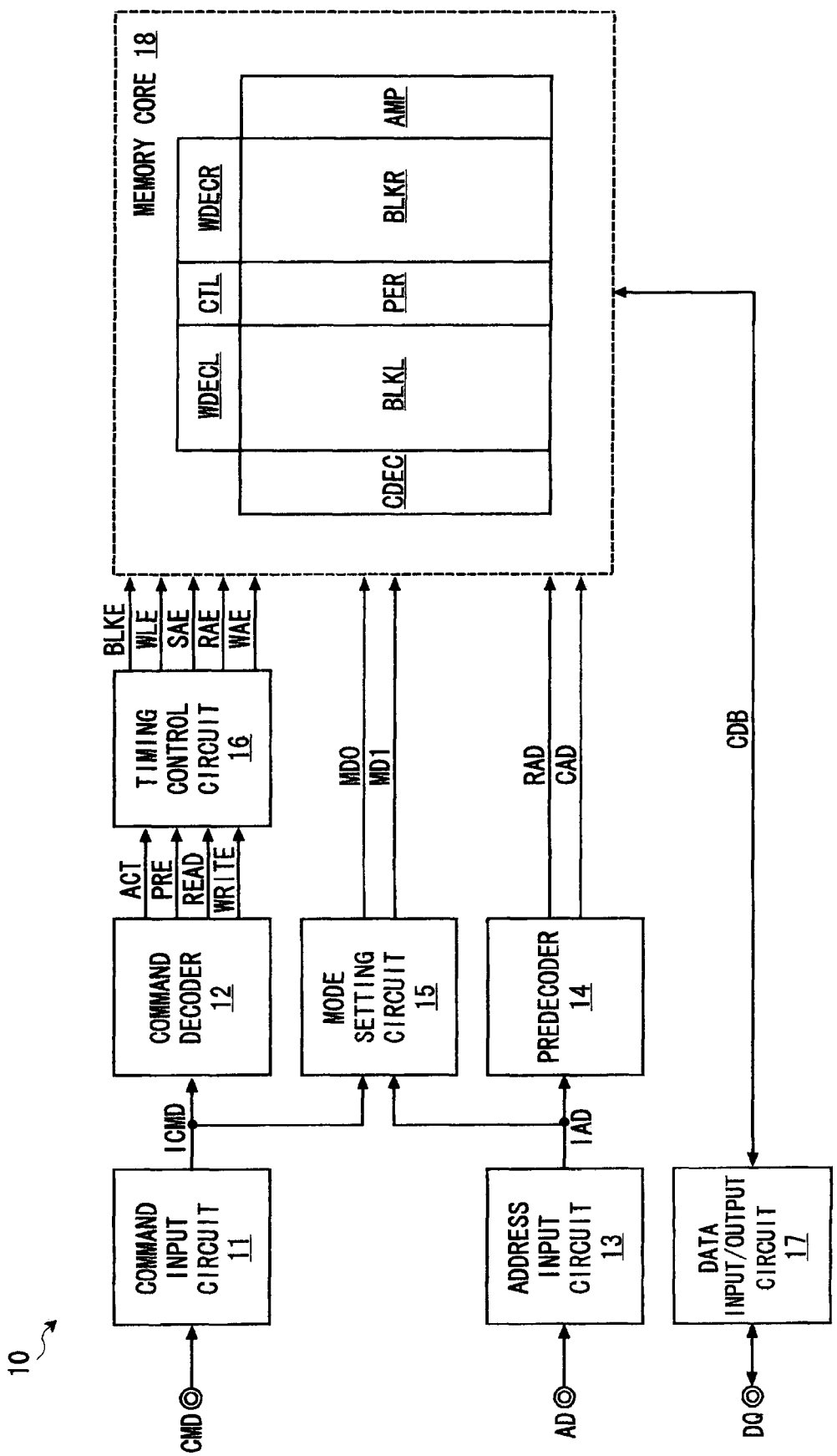
FIG. 1 shows a first embodiment.
Figure 2:
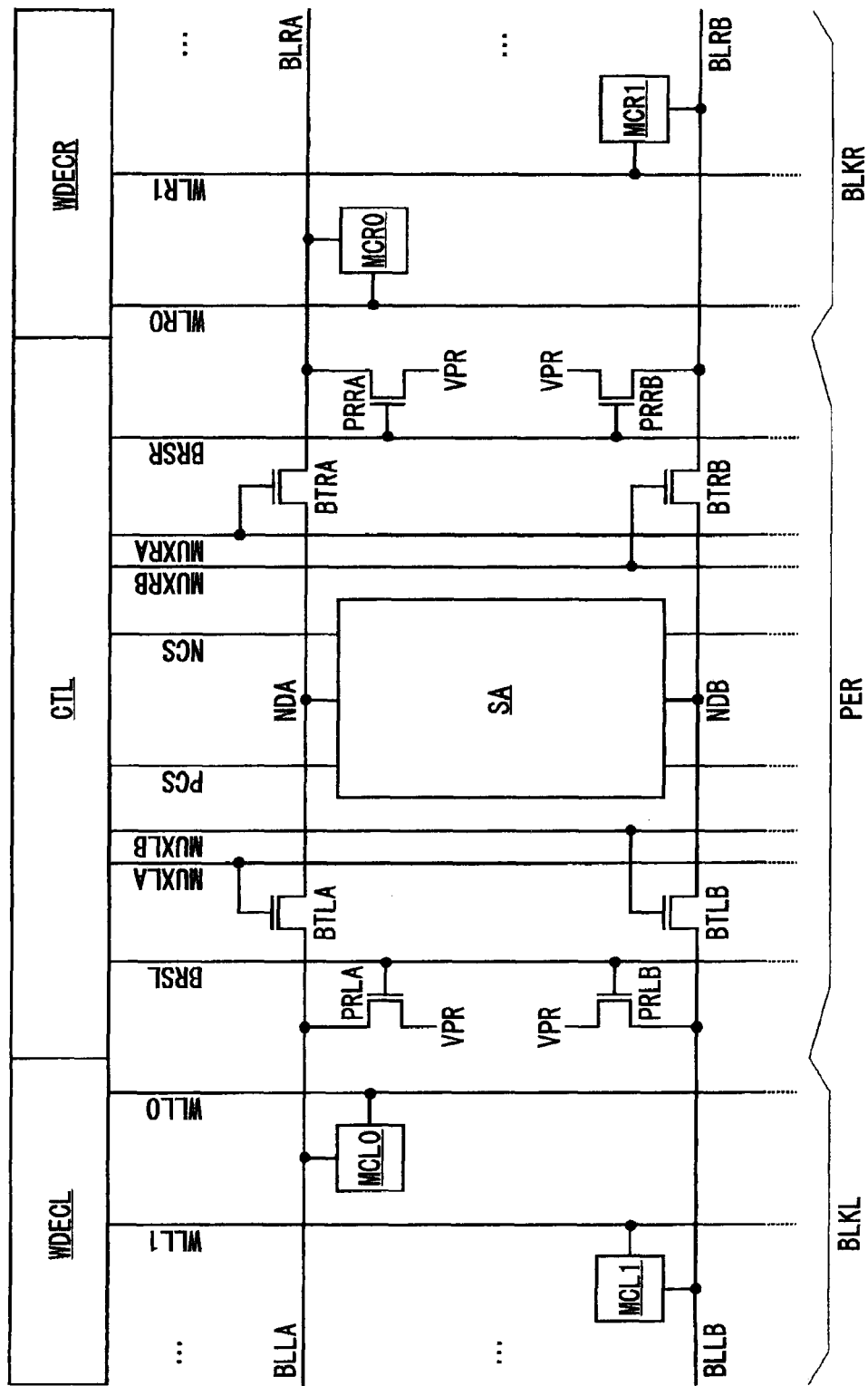
FIG. 2 shows an essential part of a memory core in FIG. 1.

FIG. 1 shows a first embodiment. FIG. 2 shows an essential part of a memory core in FIG. 1. A semiconductor memory 10 of the first embodiment includes a command input circuit 11, a command decoder 12, an address input circuit 13, a predecoder 14, a mode setting circuit 15, a timing control circuit 16, a data input/output circuit 17, and a memory core 18.

The command input circuit 11 receives a command signal CMD via a command input terminal CMD to output the received signal as an internal command signal ICMD. When detecting an active command as a result of decoding the internal command signal ICMD, the command decoder 12 temporarily activates an active signal ACT to high level. When detecting a precharge command as a result of decoding the internal command signal ICMD, the command decoder 12 temporarily activates a precharge signal PRE to high level. When detecting a read command as a result of decoding the internal command signal ICMD, the command decoder 12 temporarily activates a read signal READ to high level. When detecting a write command as a result of decoding the internal command signal ICMD, the command decoder temporarily activates a write signal WRITE to high level.

The address input circuit 13 receives an address signal AD via an address input terminal AD to output the received signal as an internal address signal IAD. The predecoder 14 receives the internal address signal IAD and selects one of a plurality of row decode signals RAD or one of a plurality of column decode signals CAD according to the received signal to activate the selected signal to high level.

The mode setting circuit 15 has a mode register which is set according to the internal command signal ICMD and the internal address signal IAD. The mode register has a bit MD0 for setting a power-conservation function invalid/valid and a bit MD1 for setting an operation mode. The bit MD0 is reset in order to set the power-conservation function invalid, and is set in order to set the power-conservation function valid. The bit MD1 is reset in order to set the operation mode to a first mode and is set in order to set the operation mode to a second mode. When the bit MD0 is reset, the mode setting circuit 15 sets a mode signal MD0 to low level. When the bit MD0 is set, the mode setting circuit 15 sets the mode signal MD0 to high level. Further, when the bit MD0 is reset, the mode setting circuit 15 sets a mode signal MD1 to low level irrespective of the bit MD1. When the bit MD0 is set and the bit MD1 is reset, the mode setting circuit 15 sets the mode signal MD1 to low level. When the bit MD0 is set and the bit MD1 is set, the mode setting circuit 15 sets the mode signal MD1 to high level.

The timing control circuit 16 outputs a block control signal BLKE, a word line control signal WLE, a sense amplifier control signal SAE, a read amplifier control signal RAE, and a write amplifier control signal WAE based on the active signal ACT, the precharge signal PRE, the read signal READ, and the write signal WRITE. Concretely, in response to the activation of the active signal ACT, the timing control circuit 16 activates the block control signal BLKE and the word line control signal WLE to high level. After a predetermined time passes from the activation of the word line control signal WLE, the timing control circuit 16 activates the sense amplifier control signal SAE to high level.

In response to the activation of the precharge signal PRE, the timing control circuit 16 inactivates the word line control signal WLE to low level. After a predetermined time passes from the inactivation of the word line control signal WLE, the timing control circuit 16 inactivates the sense amplifier control signal SAE to low level. In response to the inactivation of the sense amplifier control signal SAE, the timing control circuit 16 inactivates the block control signal BLK to low level. An inactivation period of the block control signal BLKE corresponds to a standby period of the semiconductor memory 10, and an activation period of the block control signal BLKE corresponds to an active period of the semiconductor memory 10. Further, the timing control circuit 16 temporarily activates the read amplifier control signal RAE to high level in response to the activation of the read signal READ. The timing control circuit 16 temporarily activates the write amplifier control signal WAE to high level in response to the activation of the write signal WRITE.

The data input/output circuit 17 receives read data from the memory core 18 via a common data bus CDB to output the received data to a data input/output terminal DQ. The data input/output circuit 17 receives write data which is to be written to the memory core 18, via the data input/output terminal DQ to output the received data to the common data bus CDB. The memory core 18 has a column decoder CDEC, word decoders WDECL, WDECR, blocks BLKL, BLKR, a control circuit CTL, a peripheral circuit PER, and an amplifier circuit AMP.

The block BLKL has a plurality of memory cells MCL (MCL0, MCL1, ..., MCLn) disposed in matrix at positions where a plurality of word lines WLL (WLL0, WLL1, ..., WLLn) and a plurality of bit line pairs BLLA, BLLB intersect with each other. The block BLKR has a plurality of memory cells MCR (MCR0, MCR1, ..., MCRn) disposed in matrix at positions where a plurality of word lines WLR (WLR0, WLR1, ..., WLRn) and a plurality of bit line pairs BLRA, BLRB intersect with each other.

When one of the row decode signals RAD corresponding to the word lines WLL (WLR) is selected, the word decoder WDECL (WDECR) activates the word line WLL (WLR) corresponding to the selected row decode signal RAD to high level after a predetermined time passes from the activation of the word line control signal WLE. The word decoder WDECL (WDECR) inactivates the word line WLL (WLR) to low level in response to the inactivation of the word line control signal WLE.

The control circuit CTL activates precharge control signals BRSL, BRSR to high level in response to the inactivation of the block control signal BLKE. When one of the row decode signals RAD corresponding to the word lines WLL (WLR) is selected, the control circuit CTL inactivates the precharge control signal BRSL (BRSR) to low level in response to the activation of the block control signal BLKE. After a predetermined time passes from the activation of the sense amplifier control signal SAE, the control circuit CTL activates a sense amplifier start signal line PCS to high level and further activates a sense amplifier start signal line NCS to low level. In response to the inactivation of the sense amplifier control signal SAE, the control circuit CTL inactivates the sense amplifier start signal line PCS to intermediate level and further inactivates the sense amplifier start signal line NCS to intermediate level.

Further, the control circuit CTL activates switch control signals MUXLA, MUXLB, MUXRA, MUXRB to high level in response to the inactivation of the block control signal BLKE. In a state where the mode signal MD0 is set to low level, when one of the row decode signals RAD corresponding to the word lines WLL (WLR) is selected, the control circuit CTL inactivates the switch control signals MUXRA, MUXRB (MUXLA, MUXLB) to low level in response to the activation of the block control signal BLKE.

On the other hand, in a state where the mode signal MD0 is set to high level, when one of the row decode signals RAD corresponding to the word lines WLL at whose intersection positions with the bit lines BLLA (BLLB) the memory cells MCL are disposed is selected, the control circuit CTL inactivates not only the switch control signals MUXRA, MUXRB but also the switch control signal MUXLB (MUXLA) to low level in response to the activation of the block control signal BLKE. Similarly, in the state where the mode signal MD0 is set to high level, when one of the row decode signals RAD corresponding to the word lines WLR at whose intersection positions with the bit lines BLRA (BLRB) the memory cells MCR are disposed is selected, the control circuit CTL inactivates not only the switch control signals MUXLA, MUXLB but also the switch control signal MUXRB (MUXRA) to low level in response to the activation of the block control signal BLKE.

Further, in a state where the mode signal MD1 in addition to the mode signal MD0 is set to high level, when one of the row decode signals RAD corresponding to the word lines WLL at whose intersection positions with the bit lines BLLA (BLLB) the memory cells MCL are disposed is selected, the control circuit CTL inactivates the switch control signal MUXLA (MUXLB) to low level in response to the activation of the sense amplifier control signal SAE and keeps this state for a predetermined time. Similarly, in the state where the mode signal MD1 in addition to the mode signal MD0 is set to high level, when one of the row decode signals RAD corresponding to the word lines WLR at whose intersection positions with the bit lines BLRA (BLRB) the memory cells MCR are disposed is selected, the control circuit CTL inactivates the switch control signal MUXRA (MUXRB) to low level in response to the activation of the sense amplifier control signal SAE and keeps this state for a predetermined time. Here, when the switch control signal MUXLA (MUXLB, MUXRA, MUXRB) is inactivated to low level in response to the activation of the sense amplifier control signal SAE, the predetermined time is set so that the switch control signal MUXLA (MUXLB, MUXRA, MUXRB) is activated to high level after the activation of the sense amplifier start signal lines PCS, NCS.

The peripheral circuit PER has, for each set of the bit line pair BLLA, BLLB and the bit line pair BLRA, BLRB, precharge circuits PRLA, PRLB, PRRA, PRRB, bit line switches BTLA, BTLB, BTRA, BTRB, and a sense amplifier SA. The precharge circuit PRLA (PRLB) is formed by an nMOS transistor for coupling the bit line BLLA (BLLB) to a precharge voltage line VPR. A gate of the nMOS transistor forming the precharge circuit PRLA (PRLB) receives the precharge control signal BRSL. The precharge circuit PRRA (PRRB) is formed by an nMOS transistor for coupling the bit line BLRA (BLRB) to a precharge voltage line VPR. A gate of the nMOS transistor forming the precharge circuit PRRA (PRRB) receives the precharge control signal BRSR. The bit line switch BTLA (BTLB) is formed by an nMOS transistor for coupling the bit line BLLA (BLLB) to a node NDA (NDB). A gate of the nMOS transistor forming the bit line switch BTLA (BTLB) receives the switch control signal MUXLA (MUXLB). The bit line switch BTRA (BTRB) is formed by an nMOS transistor for coupling the bit line BLRA (BLRB) to the node NDA (NDB). A gate of the nMOS transistor forming the bit line switch BTRA (BTRB) receives the switch control signal MUXRA (MUXRB).

The sense amplifier SA is formed by a latch circuit which includes, for example, two pMOS transistors and two nMOS transistors. One of the two pMOS transistors included in the sense amplifier SA has a source coupled to the sense amplifier start signal line PCS, a drain coupled to the node NDA, and a gate coupled to the node NDB. The other of the two pMOS transistors included in the sense amplifier SA has a source coupled to the sense amplifier start signal line PCS, a drain coupled to the node NDB, and a gate coupled to the node NDA. One of the two nMOS transistors included in the sense amplifier SA has a source coupled to the sense amplifier start signal line NCS, a drain coupled to the node NDA, and a gate coupled to the node NDB. The other of the nMOS transistors included in the sense amplifier SA has a source coupled to the sense amplifier start signal line NCS, a drain coupled to the node NDB, and a gate coupled to the node NDA. With such a structure, the sense amplifier SA amplifies a voltage difference of the node pair NDA, NDB in the activation period of the sense amplifier start signal lines PCS, NCS.

Further, the peripheral circuit PER also has, for each set of the bit line pair BLLA, BLLB and the bit line pair BLRA, BLRB, a column switch, not shown, coupling the node pair NDA, NDB to an internal data bus in the activation period of a column selection signal. The column selection signal is activated by the column decoder CDEC according to the column decode signal CAD. The amplifier circuit AMP amplifies a signal amount of read data on the internal data bus in response to the activation of the read amplifier control signal RAE to output the resultant to the common data bus CDB. The amplifier circuit AMP amplifies a signal amount of write data on the common data bus CDB in response to the activation of the write amplifier control signal WAE to output the resultant to the internal data bus.

Figure 3:
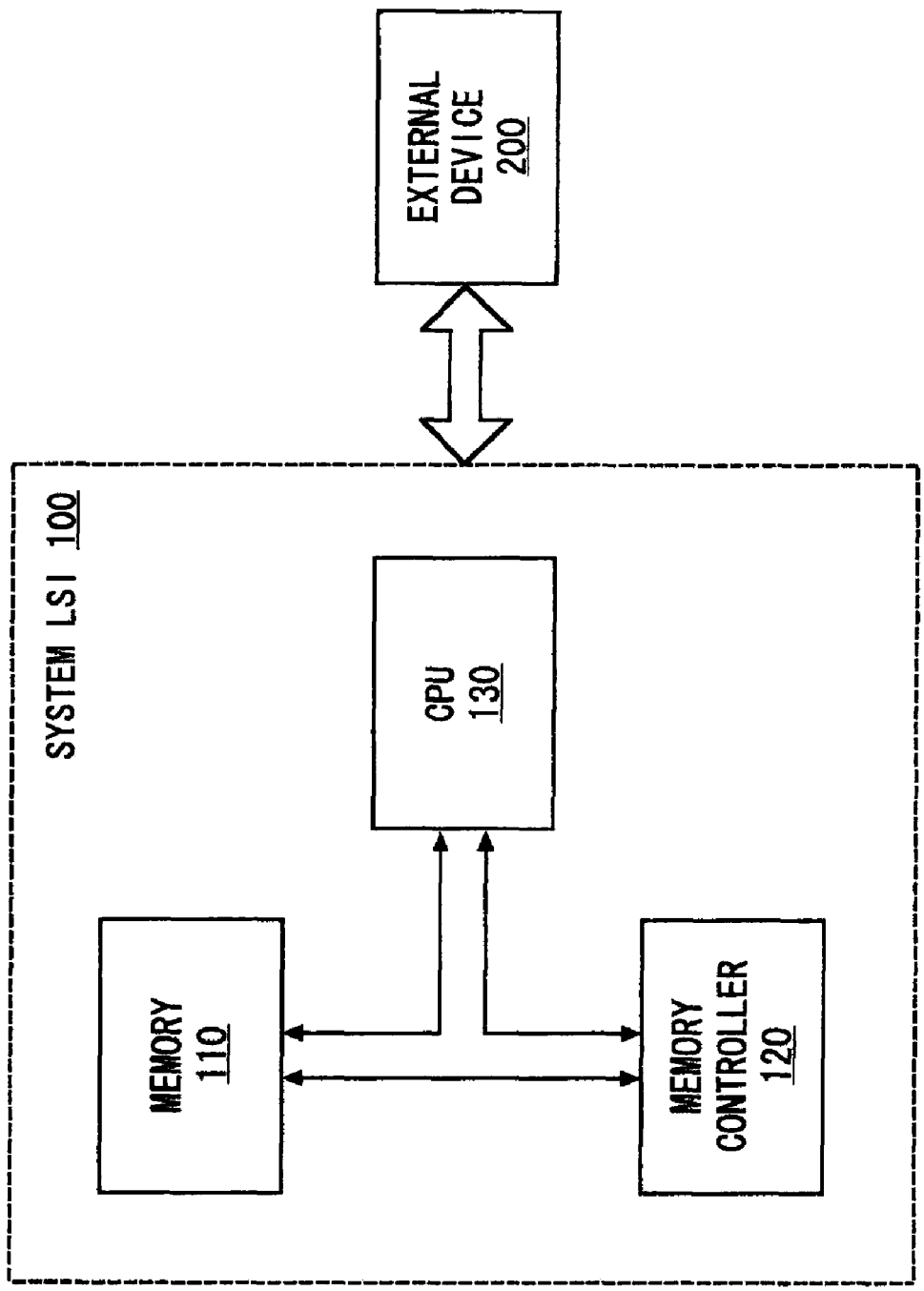
FIG. 3 shows an example of a system LSI.

FIG. 3 shows an example of a system LSI. A system LSI 100 is an image processing LSI mounted on a portable electronic device and in the system LSI 100, a memory 110 storing data, a memory controller 120 controlling the memory 110, and a CPU 130 for executing data processing and data exchange with an external device 200 are mutually coupled. The semiconductor memory 10 shown in FIG. 1 realizes the memory 110 of the system LSI 100, for instance.

Figure 4:
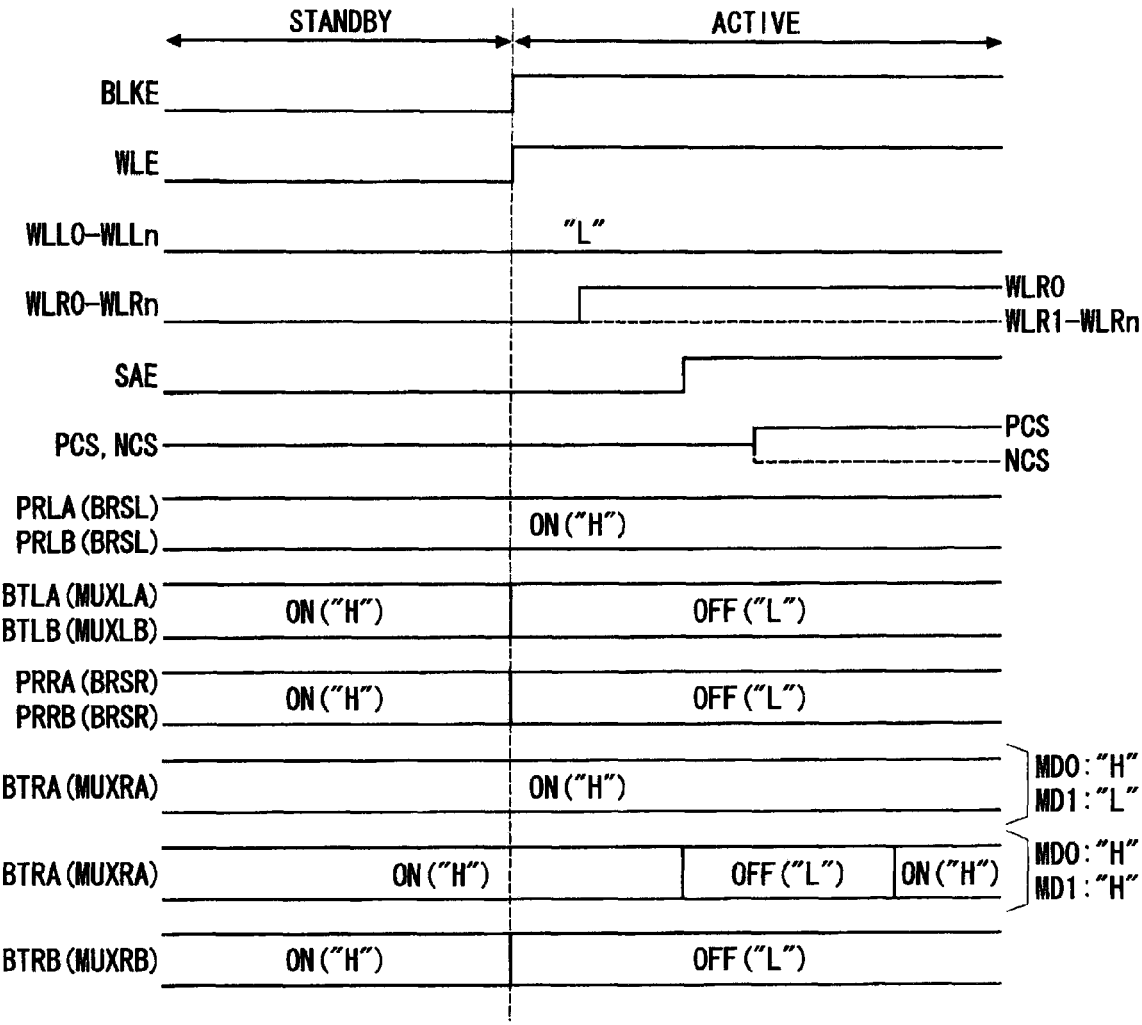
FIG. 4 shows a timing chart of a semiconductor memory of the first embodiment.

FIG. 4 shows an operation example of the semiconductor memory of the first embodiment. This operation example shows operations when the row decode signal RAD corresponding to the word line WLR0 is selected at the time when the semiconductor memory 10 shifts from a standby state to an active state, in the state where the mode signal MD0 is set to high level (state where the power-conservation function is set valid).

In the standby period of the semiconductor memory 10, the block control signal BLKE is inactive at low level and the word line control signal WLE and the sense amplifier control signal SAE are inactive at low level as well. Therefore, the word lines WLL0 to WLLn, WLR0 to WLRn are inactive at low level. The sense amplifier start signal line PCS is inactivate at intermediate level and the sense amplifier start signal line NCS is inactive at intermediate level as well. Further, the precharge control signals BRSL, BRSR are active at high level and thus the precharge circuits PRLA, PRLB, PRRA, PRRB are on. The switch control signals MUXLA, MUXLB, MULRA, MUXRB are active at high level and thus the bit line switches BTLA, BTLB, BTRA, BTRB are on. Therefore, in the standby period of the semiconductor memory 10, the bit line pair BLRA, BLRB and the bit line pair BLLA, BLLB are coupled to the sense amplifier SA (node pair NDA, NDB) while coupled to the precharge voltage lines VPR.

When the command signal CMD indicating an active command is input in this state, the block control signal BLKE and the word line control signal WLE are activated to high level. Consequently, the semiconductor memory 10 shifts to the active state from the standby state. At this time, assuming that the row decode signal RAD corresponding to the word line WLR0 is selected, the switch control signals MUXLA, MUXLB are inactivated to low level in response to the activation of the block control signal BLKE, so that the bit line switches BTLA, BTLB turn off. Consequently, the bit line pair BLLA, BLLB is separated from the sense amplifier SA. Further, since the row decode signal RAD corresponding to the word line WLR0 is selected, the precharge control signal BRSR is inactivated to low level in response to the activation of the block control signal BLKE, so that the precharge circuits PRRA, PRRB turn off. Consequently, the bit line pair BLRA, BLRB is separated from the precharge voltage line VPR. Further, since the row decode signal RAD corresponding to the word line WLR0 is selected, the switch control signal MUXRB is inactivated to low level as well in response to the activation of the block control signal BLKE, so that the bit line switch BTRB turns off as well. Consequently, the bit line BLRB is separated from the sense amplifier SA as well.

Since the row decode signal RAD corresponding to the word line WLR0 is selected, the word decoder WDECR activates the word line WLR0 to high level after a predetermined time passes from the activation of the word line control signal WLE. At this time, the bit line switch BTRA is on and the bit line BLRA has been coupled to the node NDA. Therefore, a signal read from the memory cell MCR0 to the bit line BLRA in accordance with the activation of the word line WLR0 is transmitted to the node NDA. Then, the sense amplifier control signal SAE is activated to high level after a predetermined time passes from the activation of the word line control signal WLE. Further, after a predetermined time passes from the activation of the sense amplifier control signal SAE, the sense amplifier start signal line PCS is activated to high level and the sense amplifier start signal line NCS is activated to low level. Consequently, the sense amplifier SA starts the amplification operation. At this instant, the bit line BLRB on a non-access side has been separated from the sense amplifier SA (the node NDB on a non-access side). Therefore, current consumption of the sense amplifier SA is reduced to a minimum.

When the mode signal MD0 is set to high level and the mode signal MD1 is set to low level (when the power-conservation function is set valid and the operation mode is set to the first mode), the switch control signal MUXRA is kept activated to high level after the activation of the block control signal BLKE, so that the bit line switch BTRA is kept on. Therefore, at an instant of the operation start of the sense amplifier SA, the bit line BLRA on an access side has been coupled to the sense amplifier SA (the node NDA on an access side).

On the other hand, when the mode signal MD0 is set to high level and the mode signal MD1 is set to high level (the power-conservation function is set valid and the operation mode is set to the second mode), the switch control signal MUXRA is temporarily inactivated to low level in response to the activation of the sense amplifier control signal SAE, so that the bit line switch BTRA temporarily turns off. Therefore, at the instant of the operation start of the sense amplifier SA, the access-side bit line BLRA has been separated from the sense amplifier SA (access-side node NDA). Therefore, load capacitances of the node pair NDA, NDB at the instant of the operation start of the sense amplifier SA become substantially equal to each other, which solves the problem due to a difference between the load capacitances of the node pair NDA, NDB.

Incidentally, when the mode signal MD0 is set to low level (the power-conservation function is set invalid), the switch control signals MUXRA, MUXRB are kept activated to high level after the activation of the block control signal BLKE, so that the bit line switches BTRA, BTRB are kept on. Therefore, at the instant of the operation start of the sense amplifier SA, the access-side bit line BLRA and the non-access-side bit line BLRB have been coupled to the sense amplifier SA (the access-side node NDA and the non-access-side node NDB).

In the first embodiment described above, when the power-conservation function is set valid, the non-access side of the bit line pair BLLA, BLLB (BLRA, BLRB) has been separated from the sense amplifier SA at the instant of the operation start of the sense amplifier SA, and therefore, current consumption of the sense amplifier SA can be reduced to a minimum, which can greatly contribute to a reduction in power consumption of the semiconductor memory 10. Further, since the invalidity/validity of the power-conservation function can be selected via the mode setting circuit 15 (mode register), the semiconductor memory 10 is applicable to systems with various specifications.

Further, when the power-conservation function is set valid and the operation mode is set to the second mode, the access side in addition to the non-access side of the bit line pair BLLA, BLLB (BLRA, BLRB) has been separated from the sense amplifier at the instant of the operation start of the sense amplifier SA, which can solve the problem due to a difference between the load capacitances of the node pair NDA, NDB at the instant of the operation start of the sense amplifier SA.

Figure 5:
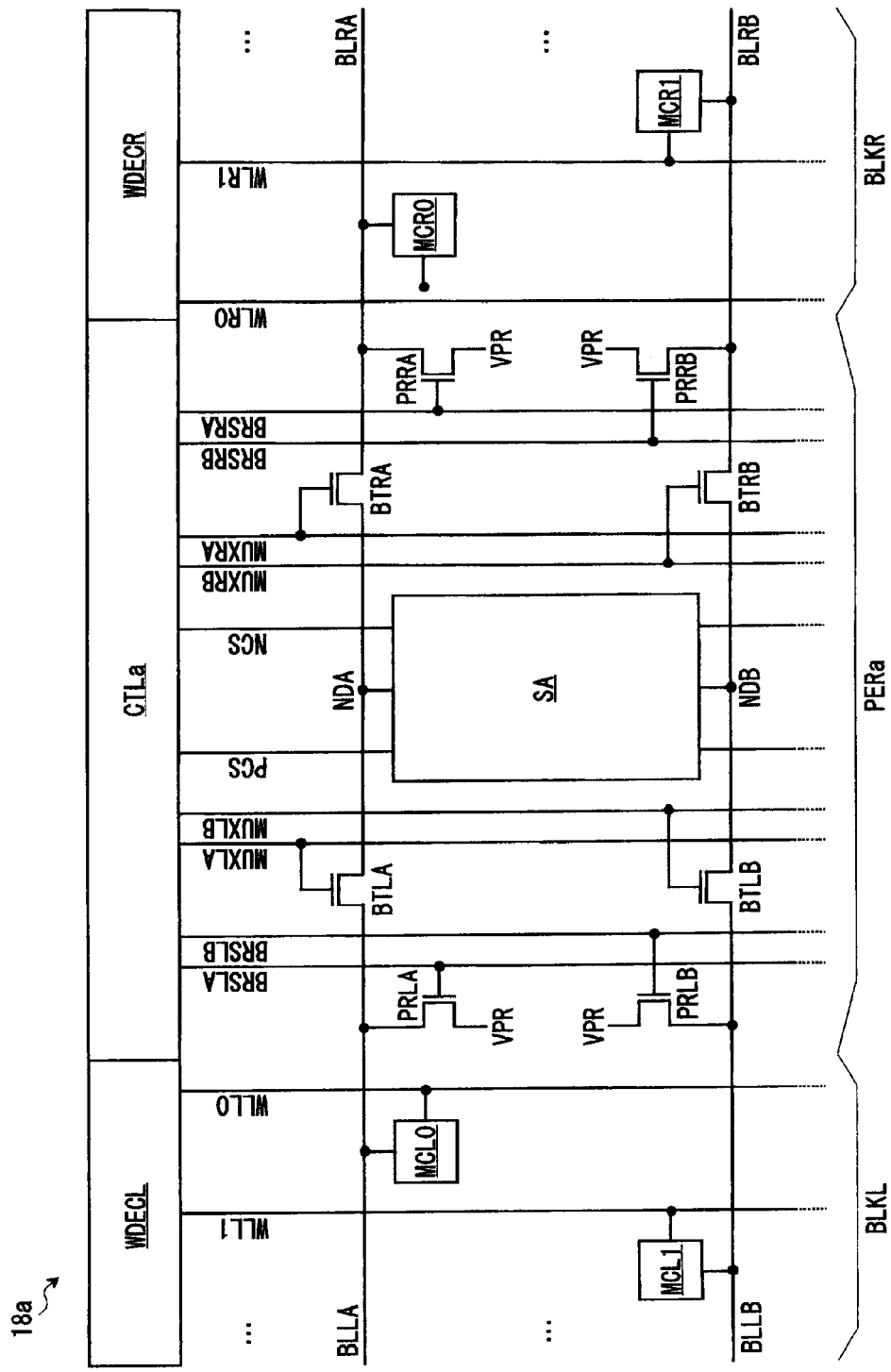
FIG. 5 shows a second embodiment.

FIG. 5 shows a second embodiment. In the description of the second embodiment, the same elements as the elements described in the first embodiment will be denoted by the same reference numerals and symbols, and detailed description thereof will be omitted. A semiconductor memory of the second embodiment is structured such that a memory core 18a is provided in place of the memory core 18 of the semiconductor memory 10 of the first embodiment. For example, the semiconductor memory of the second embodiment realizes the memory 110 of the system LSI 100 shown in FIG. 3, similarly to the semiconductor memory 10 of the first embodiment. The memory core 18a of the second embodiment is structured such that a control circuit CTLa and a peripheral circuit PERa are provided in place of the control circuit CTL and the peripheral circuit PER of the memory core 18 of the first embodiment.

The control circuit CTLa of the second embodiment is the same as the control circuit CTL of the first embodiment except that it outputs precharge control signals BRSLA, BRSLB in place of the precharge control signal BRSL of the first embodiment and outputs precharge control signals BRSRA, BRSRB in place of the precharge control signal BRSR of the first embodiment.

The control circuit CTLa activates the precharge control signals BRSLA, BRSLB, BRSRA, BRSRB to high level in response to the inactivation of a block control signal BLKE. In a state where a mode signal MD0 is set to low level, when one of row decode signals RAD corresponding to word lines WLL (WLR) is selected, the control circuit CTLa inactivates the precharge control signals BRSLA, BRSLB (BRSRA, BRSRB) to low level in response to the activation of the block control signal BLKE.

On the other hand, in a state where the mode signal MD0 is set to high level, when one of the row decode signals RAD corresponding to the word lines WLL at whose intersection positions with bit lines BLLA (BLLB) memory cells MCL are disposed is selected, the control circuit CTLa inactivates the precharge control signal BRSLA (BRSLB) to low level in response to the block control signal BLKE. Similarly, in the state where the mode signal MD0 is set to high level, when one of the row decode signals RAD corresponding to the word lines WLR at whose intersection positions with bit lines BLRA (BLRB) memory cells MCR are disposed is selected, the control circuit CTLa inactivates the precharge control signal BRSRA (BRSRB) to low level in response to the activation of the block control signal BLKE.

The peripheral circuit PERa of the second embodiment is the same as the peripheral circuit PER of the first embodiment except that a gate of an nMOS transistor forming a precharge circuit PRLA (PRLB) receives the precharge control signal BRSLA (BRSLB) and a gate of an nMOS transistor forming a precharge circuit PRRA (PRRB) receives the precharge control signal BRSRA (BRSRB).

Figure 6:
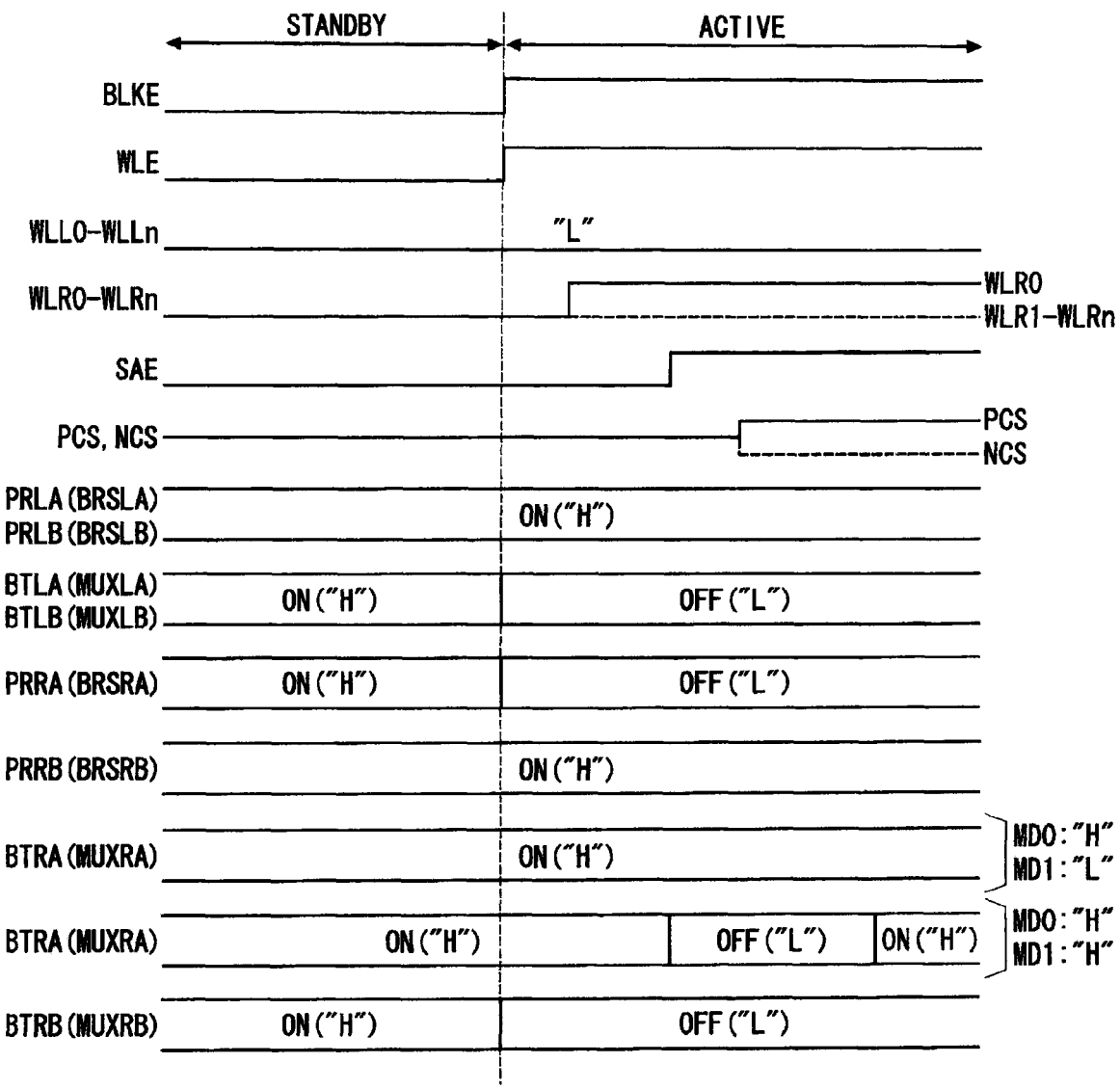
FIG. 6 shows a timing chart of a semiconductor memory of the second embodiment.

FIG. 6 shows an operation example of the semiconductor memory of the second embodiment. This operation example shows operations when the row decode signal RAD corresponding to a word line WLR0 is selected when the semiconductor memory shifts from a standby state to an active state in the state where the mode signal MD0 is set to high level. Therefore, in this operation example, signals except the precharge control signals BRSLA, BRSLB, BRSRA, BRSRB and circuits except the precharge circuits PRLA, PRLB, PRRA, PRRB operate in the same manner as in the operation example of the semiconductor memory of the first embodiment (FIG. 4).

In a standby period of the semiconductor memory, the precharge control signals BRSLA, BRSLB, BRSRA, BRSRB are active at high level, so that the precharge circuits PRLA, PRLB, PRRA, PRRB are on. Therefore, in the standby period of the semiconductor memory, the bit line pair BLLA, BLLB and the bit line pair BLRA, BLRB are coupled to precharge voltage lines VPR.

When a command signal CMD indicating an active command is input in this state, the precharge control signal BRSRA is inactivated to low level in response to the activation of the block control signal BLKE since the row decode signal RAD corresponding to the word line WLR0 is selected, so that the precharge circuit PRRA turns off. Consequently, the access-side bit line BLRA is separated from the precharge voltage line VPR. On the other hand, the precharge control signal BRSRB is kept activated to high level even after the activation of the block control signal BLKE, so that the precharge circuit PRRB is kept on. Therefore, the non-accessside bit line BLRB is kept coupled to the precharge voltage line VPR after the operation start of a sense amplifier SA. This can solve the problem occurring because the non-access-side bit line BLRB comes into a floating state. Further, after the activation of the block control signal BLKE, a bit line switch BTRB is off, so that the non-access-side bit line BLRB is separated from the sense amplifier SA (non-access-side node NDB). Therefore, even when the non-access-side bit line BLRB is kept coupled to the precharge voltage line VPR after the activation of the block control signal BLKE, there is no influence on the amplification operation of the sense amplifier SA. Incidentally, when the mode signal MD0 is set to low level, the precharge control signal BRSRB in addition to the precharge control signal BRSRA is inactivated to low level in response to the activation of the block control signal BLKE, so that the precharge circuit PRRB in addition to the precharge circuit PRRA turns off.

The second embodiment described above provides the same effects as those of the first embodiment. In addition, in the second embodiment, since the non-access side of the bit line pair BLLA, BLLB (BLRA, BLRB) is not separated from the precharge voltage line VPR when the power-conservation function is set valid, which can solve the problem occurring because the non-access side of the bit line pair BLLA, BLLB (BLRA, BLRB) comes into the floating state.

Figure 7:
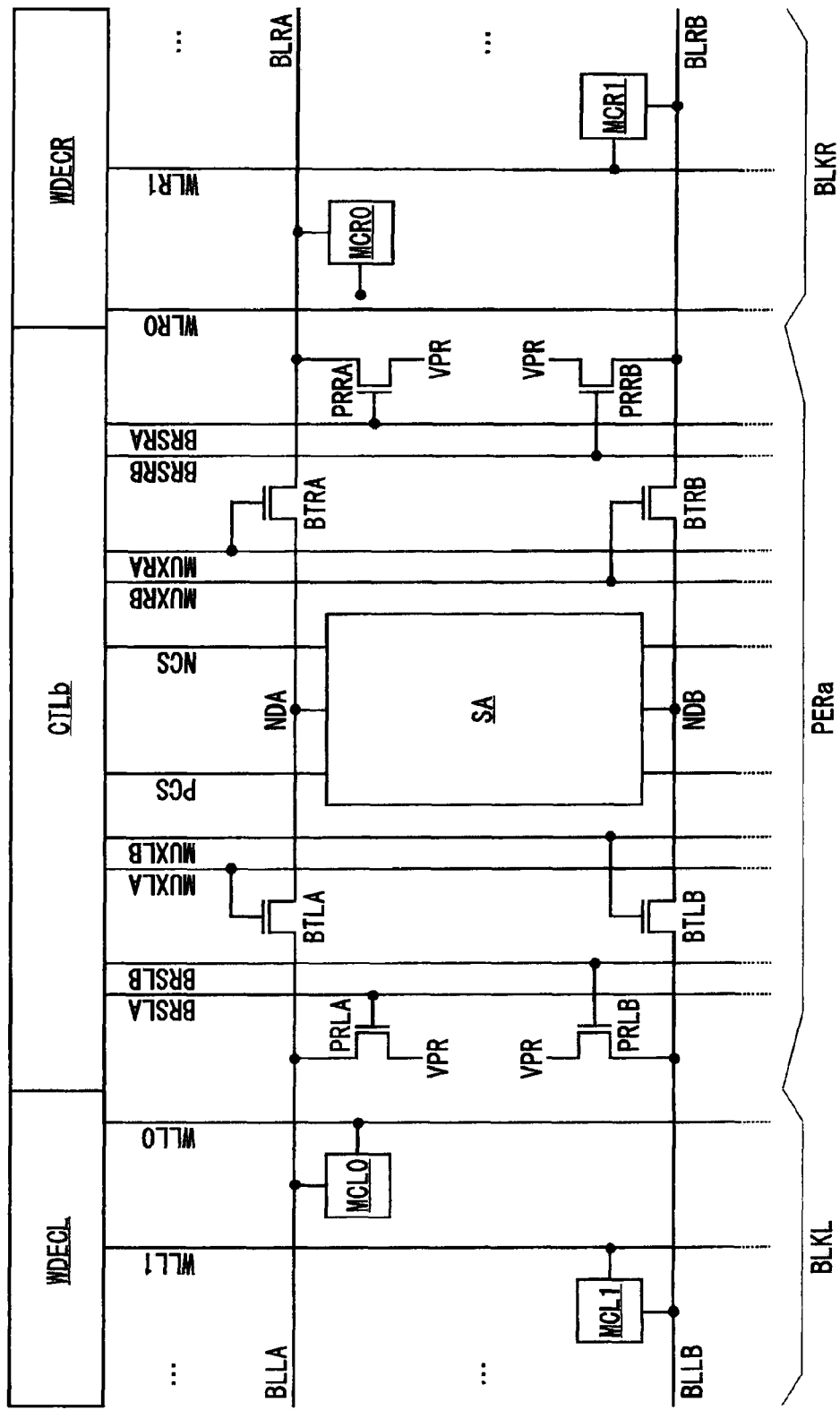
FIG. 7 shows a third embodiment.

FIG. 7 shows a third embodiment. In the description of the third embodiment, the same elements as the elements described in the first and second embodiments will be denoted by the same reference numerals and symbols, and detailed description thereof will be omitted. A semiconductor memory of the third embodiment is structured such that a memory core 18*b* is provided in place of the memory core 18 of the semiconductor memory 10 of the first embodiment. For example, the semiconductor memory of the third embodiment realizes the memory 110 of the system LSI 100 shown in FIG. 3, similarly to the semiconductor memory 10 of the first embodiment. The memory core 18*b* of the third embodiment is structured such that a control circuit CTLb is provided in place of the control circuit CTLa of the memory core 18*a* of the second embodiment.

The control circuit CTLb of the third embodiment is the same as the control circuit CTLa of the second embodiment except that its output operation of switch control signals MUXLA, MUXLB, MUXRA, MUXRB is different. The control circuit CTLb activates the switch control signals MUXLA, MUXLB, MUXRA, MUXRB to high level in response to the inactivation of a block control signal BLKE. In a state where a mode signal MD0 is set to low level, when one of row decode signals RAD corresponding to word lines WLL (WLR) is selected, the control circuit CTLb inactivates the switch control signals MUXRA, MUXRB (MUXLA, MUXLB) to low level in response to the activation of the block control signal BLKE.

On the other hand, in a state where the mode signal MD0 is set to high level, when one of the row decode signals RAD corresponding to the word lines WLL at whose intersection positions with bit lines BLLA (BLLB) memory cells MCL are disposed is selected, the control circuit CTLb inactivates the switch control signals MUXRA, MUXRB to low level in response to the activation of the block control signal BLKE, and inactivates the switch control signal MUXLB (MUXLA) to low level in response to the activation of a sense amplifier control signal SAE. Similarly, in the state where the mode signal MD0 is set to high level, when one of the row decode signals RAD corresponding to the word lines WLR at whose intersection positions with the bit lines BLRA (BLRB) memory cells MCR are disposed is selected, the control circuit CTLb inactivates the switch control signals MUXLA, MUXLB to low level in response to the activation of the block control signal BLKE and inactivates the switch control signal MUXRB (MUXRA) to low level in response to the activation of the sense amplifier control signal SAE.

Further, in a state where a mode signal MD1 in addition to the mode signal MD0 is set to high level, when one of the row decode signals RAD corresponding to the word lines WLL at whose intersection positions with the bit lines BLLA (BLLB) the memory cells MCL are disposed is selected, the control circuit CTLb inactivates the switch control signal MUXLA (MUXLB) to low level in response to the activation of the sense amplifier control signal SAE and keeps this state for a predetermined time. Similarly, in the state where the mode signal MD1 in addition to the mode signal MD0 is activated to high level, when one of the row decode signals RAD corresponding to the word lines WLR at whose intersection positions with the bit lines BLRA (BLRB) the memory cells MCR are disposed is selected, the control circuit CTLb inactivates the switch control signal MUXRA (MUXRB) to low level in response to the activation of the sense amplifier control signal SAE and keeps this state for a predetermined time. Here, when the switch control signal MUXLA (MUXLB, MUXRA, MUXRB) is inactivated to low level in response to the activation of the sense amplifier control signal SAE, the predetermined time is set so that the switch control signal MUXLA (MUXLB, MUXRA, MUXRB) is activated to high level after the activation of sense amplifier start signal lines PCS, NCS.

Figure 8:
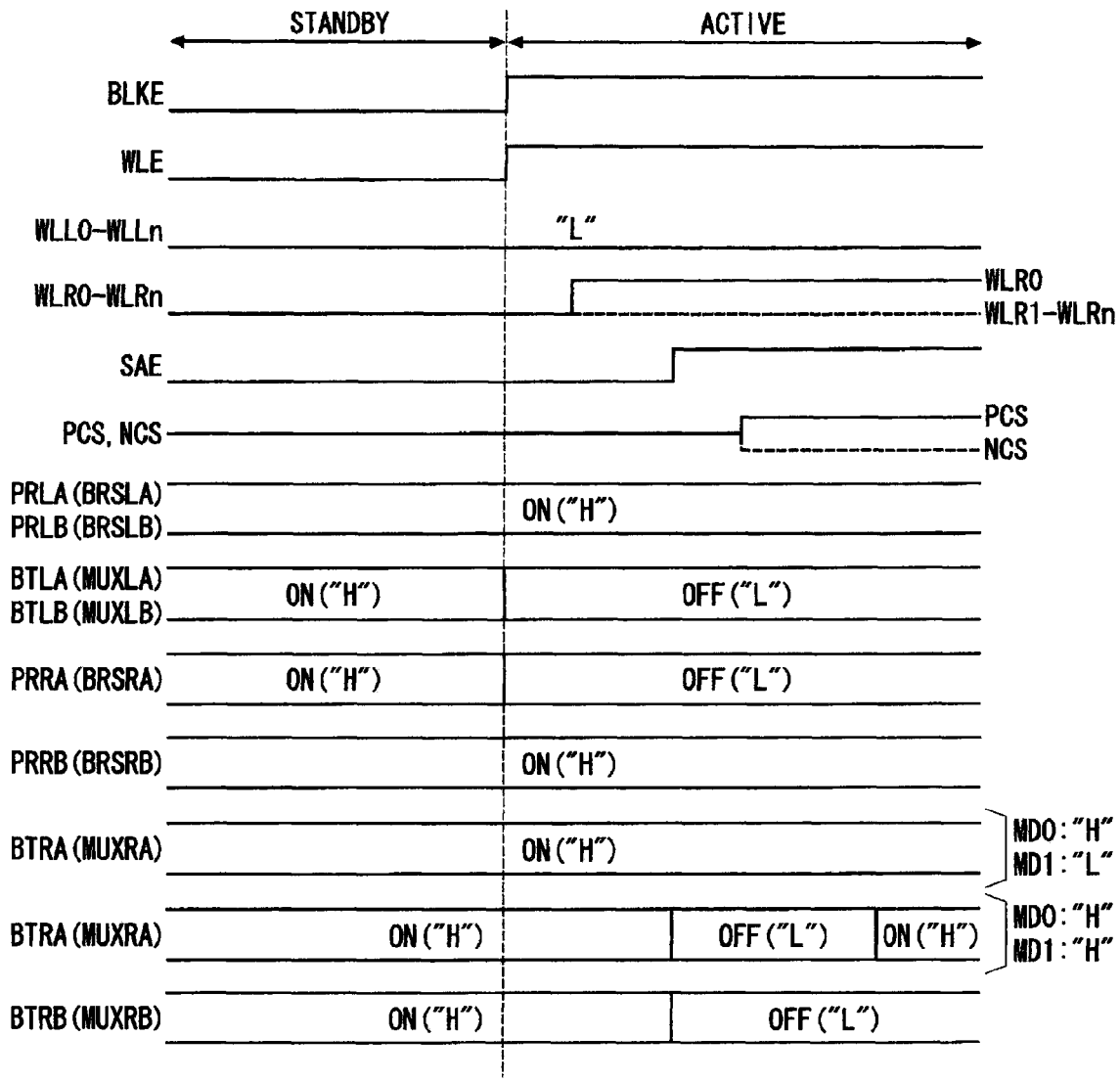
FIG. 8 shows a timing chart of a semiconductor memory of the third embodiment.

FIG. 8 shows an operation example of the semiconductor memory of the third embodiment. This operation example shows operations when the row decode signal RAD corresponding to a word line WLR0 is selected when the semiconductor memory shifts from a standby state to an active state in the state where the mode signal MD0 is set to high level. Therefore, in this operation example, signals except the switch control signals MUXLA, MUXLB, MUXRA, MUXRB and circuits except bit line switches BTLA, BTLB, BTRA, BTRB operate in the same manner as in the operation example of the semiconductor memory of the second embodiment (FIG. 6).

In a standby period of the semiconductor memory, the switch control signals MUXLA, MUXLB, MUXRA, MUXRB are active at high level, so that the bit line switches BTLA, BTLB, BTRA, BTRB are on. Therefore, in the standby period of the semiconductor memory, the bit line pair BLLA, BLLB and the bit line pair BLRA, BLRB are coupled to the sense amplifier SA (node pair NDA, NDB) while coupled to precharge voltage lines VPR.

When a command signal CMD indicating an active command is input in this state, the switch control signals MUXLA, MUXLB are inactivated to low level in response to the activation of the block control signal BLKE since the row decode signal RAD corresponding to the word line WLR0 is selected, so that the bit line switches BTLA, BTLB turn off. Consequently, the bit line pair BLLA, BLLB is separated from the sense amplifier SA. Then, since the row decode signal RAD corresponding to the word line WLR0 is selected, the switch control signal MUXRB is inactivated to low level in response to the activation of the sense amplifier control signal SAE, so that the bit line switch BTRB turns off. Consequently, the bit line BLRB is separated from the sense amplifier SA. Thereafter, the switch control signals MUXLA, MUXLB, MUXRA, MUXRB and the bit line switches BTLA, BTLB, BTRA, BTRB operate in the same manner as in the operation example of the semiconductor memory of the second embodiment (FIG. 6).

As described above, in the period from the activation of the block control signal BLKE to the activation of the sense amplifier control signal SAE, the switch control signal MUXRB is active at high level and the bit line switch BTRB is on. Therefore, the non-access-side bit line BLRB is coupled to a non-access-side node NDB in the period from the activation of the block control signal BLKE to the activation of the sense amplifier control signal SAE. Further, in the period from the activation of the block control signal BLKE to the activation of the sense amplifier control signal SAE, a precharge circuit PRRB is on and the non-access-side bit line BLRB is coupled to the precharge voltage line VPR. Therefore, the problem occurring because the non-access side node NDB comes into a floating state is solved. Incidentally, when the mode signal MD0 is set to low level, the switch control signals MUXRA, MUXRB are kept activated to high level even after the activation of the block control signal, so that the bit line switches BTRA, BTRB are kept on even after the activation of the block control signal BLKE.

The third embodiment described above can provide the same effects as those of the first and second embodiments. In addition, in the third embodiment, when the power-conservation function is set valid, in the period from the activation of the block control signal BLKE (word line control signal WLE) to the activation of the sense amplifier control signal SAE, the non-access side of the bit line pair BLLA, BLLB (BLRA, BLRB) is coupled to the non-access side of the node pair NDA, NDB while coupled to the precharge voltage line VPR, and therefore, the problem occurring because the non-access side of the node pair NDA, NDB comes into the floating state can be solved.

Figure 9:
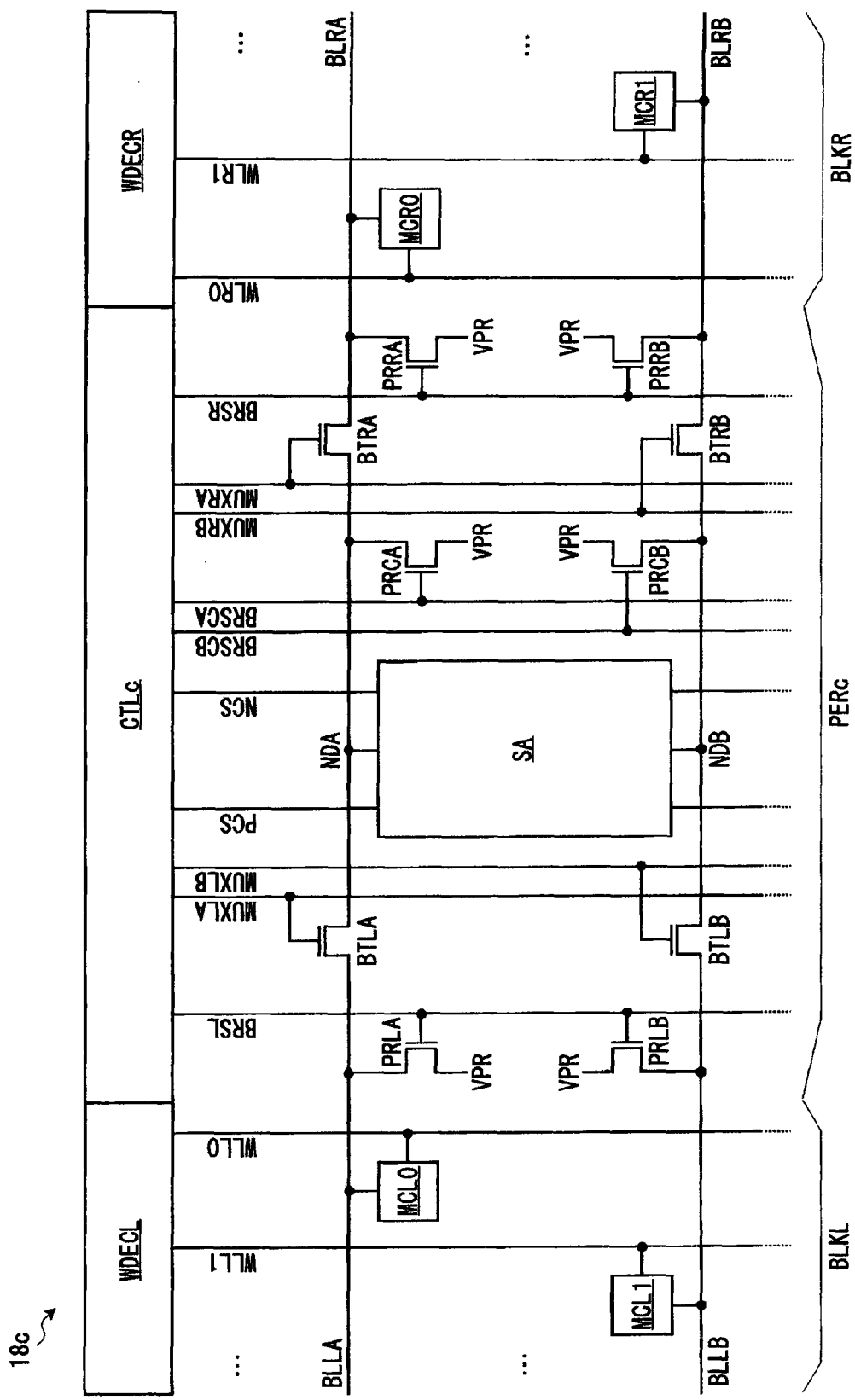
FIG. 9 shows a fourth embodiment.

FIG. 9 shows a fourth embodiment. In the description of the fourth embodiment, the same elements as the elements described in the first embodiment will be denoted by the same reference numerals and symbols, and detailed description thereof will be omitted. A semiconductor memory of the fourth embodiment is structured such that a memory core 18c is provided in place of the memory core 18 of the semiconductor memory 10 of the first embodiment. For example, the semiconductor memory of the fourth embodiment realizes the memory 10 of the system LSI 100 shown in FIG. 3, similarly to the semiconductor memory 10 of the first embodiment. The memory core 18c of the fourth embodiment is structured such that a control circuit CTLc and a peripheral circuit PERc are provided in place of the control circuit CTL and the peripheral circuit PER of the memory core 18 of the first embodiment.

The control circuit CTLc of the fourth embodiment is the same as the control circuit CTL of the first embodiment except that it outputs precharge control signals BRSCA, BRSCB. The control circuit CTLc activates the precharge control signals BRSCA, BRSCB to high level in response to the inactivation of a block control signal BLKE. When one of row decode signals RAD corresponding to word lines WLL (WLR) at whose intersection positions with bit lines BLLA (BLRA) memory cells MCL (MCR) are disposed is selected, the control circuit CTLc inactivates the precharge control signal BRSCA to low level in response to the activation of the block control signal BLKE, and inactivates the precharge control signal BRSCB to low level in response to the activation of a sense amplifier control signal SAE. Similarly, when one of row decode signals RAD corresponding to word lines WLL (WLR) at whose intersection positions with bit lines BLLB (BLRB) memory cells MCL (MCR) are disposed is selected, the control circuit CTLc inactivates the precharge control signal BRSCB to low level in response to the activation of the block control signal BLKE and inactivates the precharge control signal BRSCA to low level in response to the activation of the sense amplifier control signal SAE.

The peripheral circuit PERc of the fourth embodiment is the same as the peripheral circuit PER of the first embodiment except that it has precharge circuits PRCA, PRCB for each set of the bit line pair BLLA, BLLB and the bit line pair BLRA, BLRB. The precharge circuit PRCA (PRCB) is formed by an nMOS transistor for coupling a node NDA (NDB) to a precharge voltage line VPR. A gate of the nMOS transistor forming the precharge circuit PRCA (PRCB) receives the precharge control signal BRSCA (BRSCB).

Figure 10:
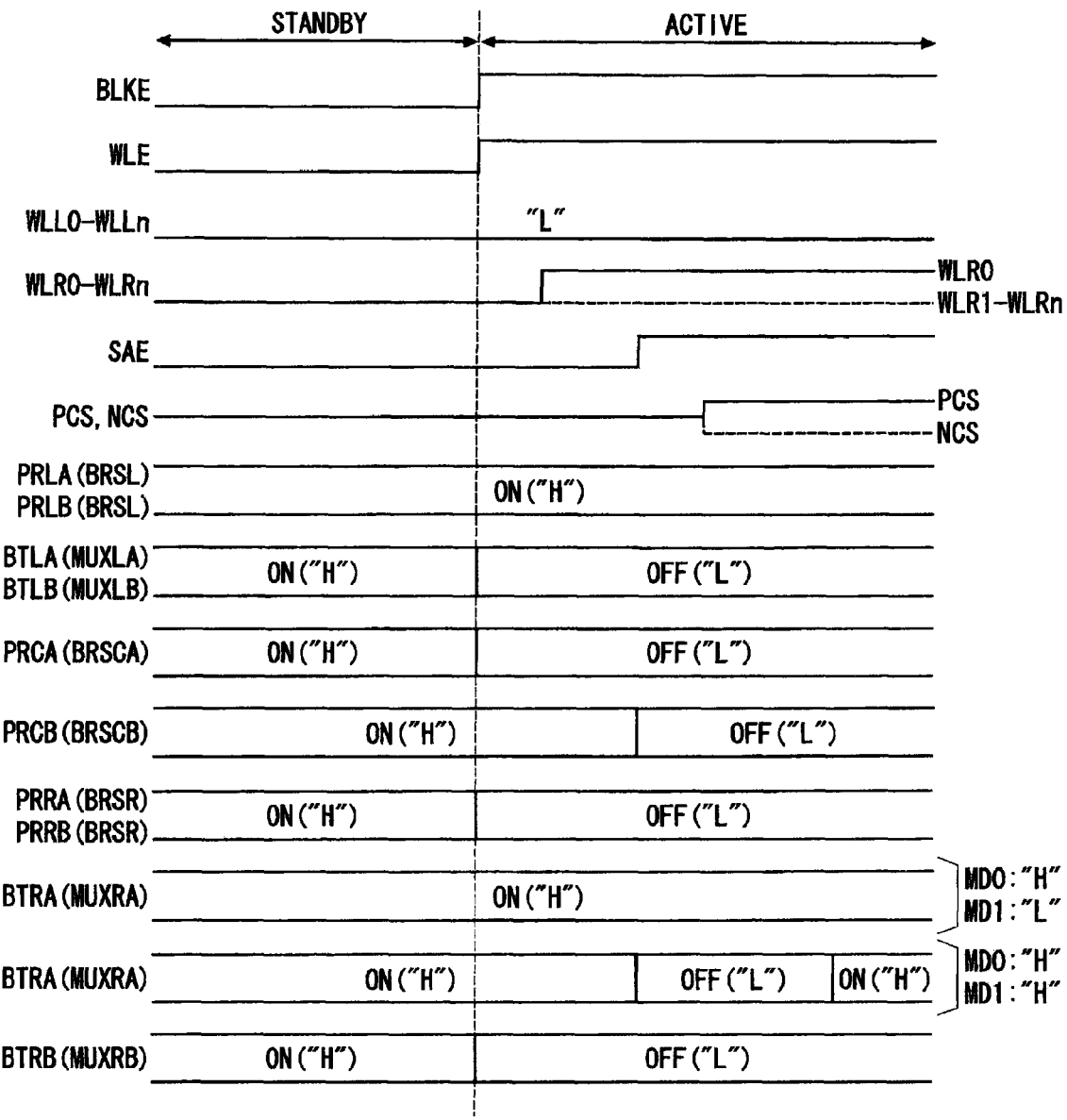
FIG. 10 shows a timing chart of a semiconductor memory of the fourth embodiment.

FIG. 10 shows an operation example of the semiconductor memory of the fourth embodiment. This operation example shows operations when the row decode signal RAD corresponding to a word line WLR0 is selected when the semiconductor memory shifts from a standby state to an active state in a state where a mode signal MD0 is set to high level. Therefore, in this operation example, signals except the precharge control signals BRSCA, BRSCB and circuits except the precharge circuits PRCA, PRCB operate in the same manner as in the operation example of the semiconductor memory of the first embodiment (FIG. 4).

In a standby period of the semiconductor memory, the precharge control signals BRSCA, BRSCB are active at high level, so that the precharge circuits PRCA, PRCB are on. Therefore, in the standby period of the semiconductor memory, the node pair NDA, NDB is coupled to the precharge voltage lines VPR.

When a command signal CMD indicating an active command is input in this state, the precharge control signal BRSCA is inactivated to low level in response to the activation of the block control signal BLKE since the row decode signal RAD corresponding to the word line WLR0 is selected, so that the precharge circuit PRCA turns off. Consequently, the access-side node NDA is separated from the precharge voltage line VPR. Then, the precharge control signal BRSCB is inactivated to low level in response to the activation of the sense amplifier control signal SAE, so that the precharge circuit PRCB turns off. Consequently, the non-access-side node NDB is separated from the precharge voltage line VPR.

As described above, in the period from the activation of the block control signal BLKE to the activation of the sense amplifier control signal SAE, the precharge control signal BRSCB is active at high level, so that the precharge circuit PRRB is on. Therefore, in the period from the activation of the block control signal BLKE to the activation of the sense amplifier control signal SAE, the non-access-side node NDB is coupled to the precharge voltage line VPR. Therefore, the problem occurring because the non-access-side node NDB comes into the floating state is solved.

The fourth embodiment described above can provide the same effects as those of the first embodiment. In addition, in the fourth embodiment, in the period from the activation of the block control signal BLKE (word line control signal WLE) to the activation of the sense amplifier control signal SAE, the non-access side of the node pair NDA, NDB is coupled to the precharge voltage line VPR, which can solve the problem occurring because the non-access side of the node pair NDA, NDB comes into the floating state.

Figure 11:
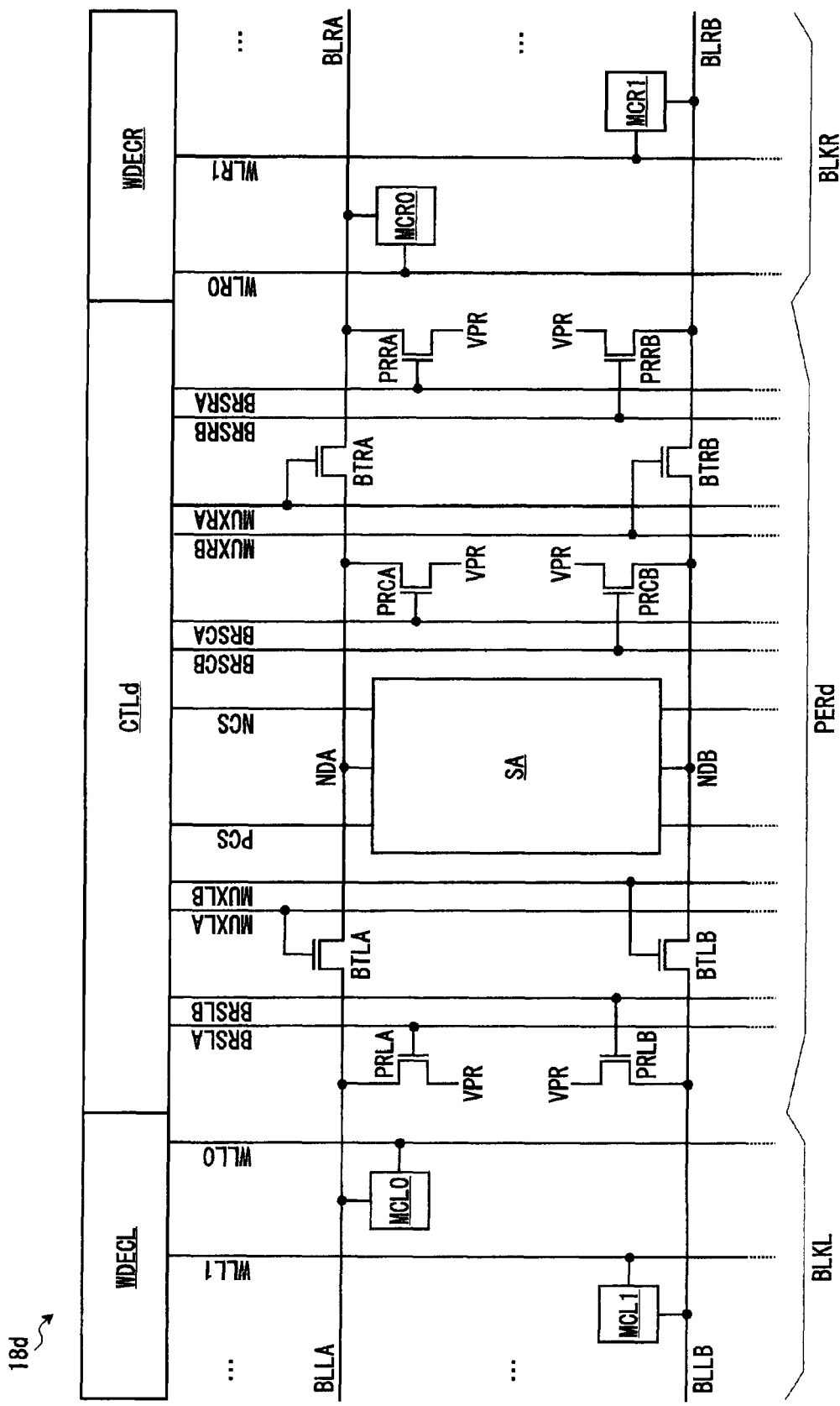
FIG. 11 shows a fifth embodiment.

FIG. 11 shows a fifth embodiment. In the description of the fifth embodiment, the same elements as the elements described in the first, second, and fourth embodiments will be denoted by the same reference numerals and symbols, and detailed description thereof will be omitted. A semiconductor memory of the fifth embodiment is structured such that a memory core 18d is provided in place of the memory core 18 of the semiconductor memory 10 of the first embodiment. For example, the semiconductor memory of the fifth embodiment realizes the memory 110 of the system LSI 100 shown in FIG. 3, similarly to the semiconductor memory 10 of the first embodiment. The memory core 18d of the fifth embodiment is structured such that a control circuit CTLd and a peripheral circuit PERd are provided in place of the control circuit CTL and the peripheral circuit PER of the memory core 18 of the first embodiment.

The control circuit CTLd of the fifth embodiment is the same as the control circuit CTLa of the second embodiment except that it outputs precharge control signals BRSCA, BRSCB similarly to the control circuit CTLc of the fourth embodiment. The peripheral circuit PERc of the fifth embodiment is the same as the peripheral circuit PERa of the second embodiment except that it has the precharge circuits PRCA, PRCB of the fourth embodiment.

Figure 12:
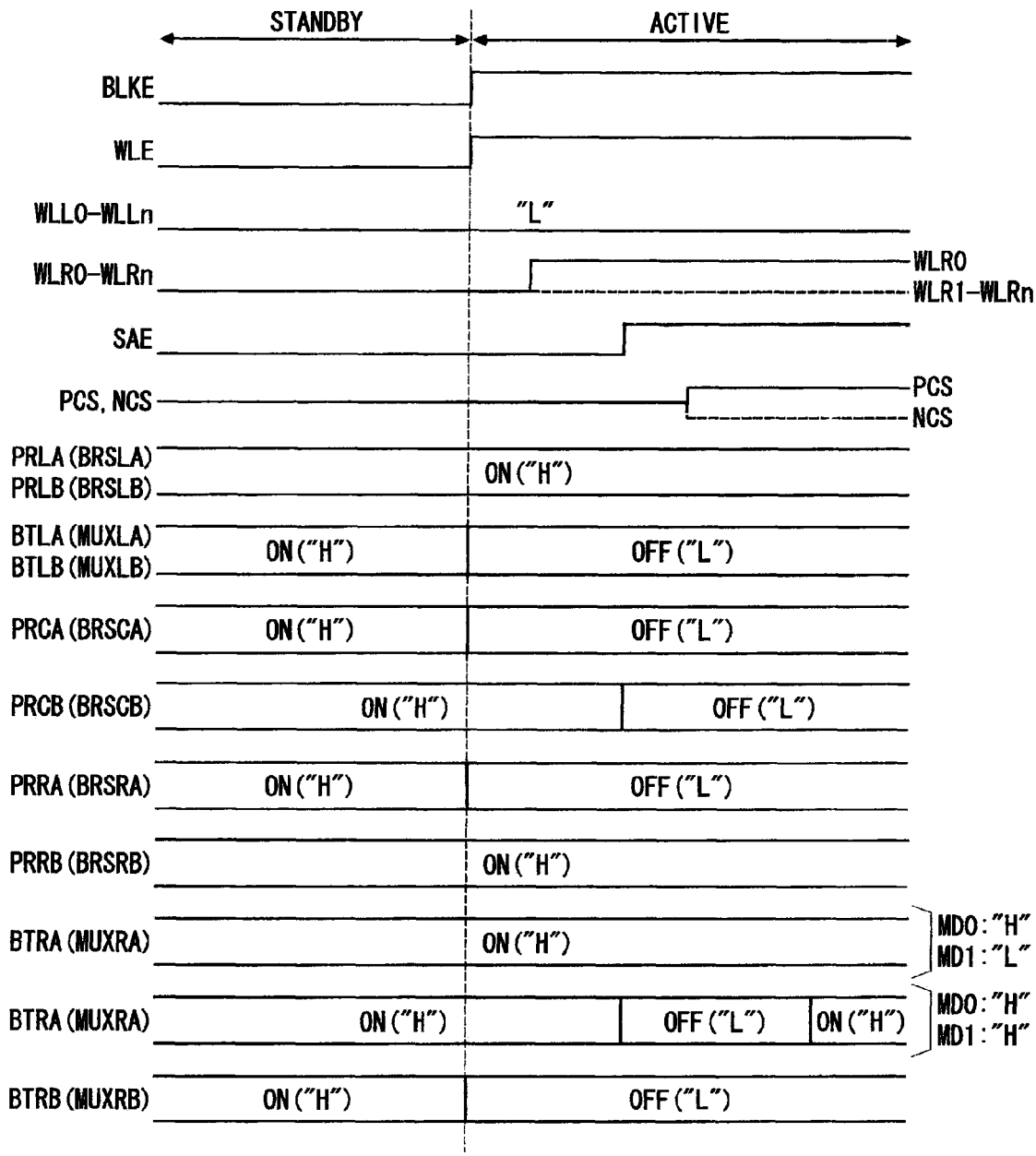
FIG. 12 shows a timing chart of a semiconductor memory of the fifth embodiment.

FIG. 12 shows an operation example of the semiconductor memory of the fifth embodiment. This operation example shows operations when a row decode signal RAD corresponding to a word line WLR0 is selected when the semiconductor memory shifts from a standby state to an active state in a state where a mode signal MD0 is set to high level. Therefore, in this operation example, signals except the precharge control signals BRSCA, BRSCB and circuits except the precharge circuits PRCA, PRCB operate in the same manner as in the operation example of the semiconductor memory of the second embodiment (FIG. 6). The precharge control signals BRSCA, BRSCB and the precharge circuits PRCA, PRCB operate in the same manner as in the operation example of the semiconductor memory of the fourth embodiment (FIG. 10). The fifth embodiment described above can provide the same effects as those of the fourth embodiment as well as the same effects as those of the first and second embodiments.

Figure 13:
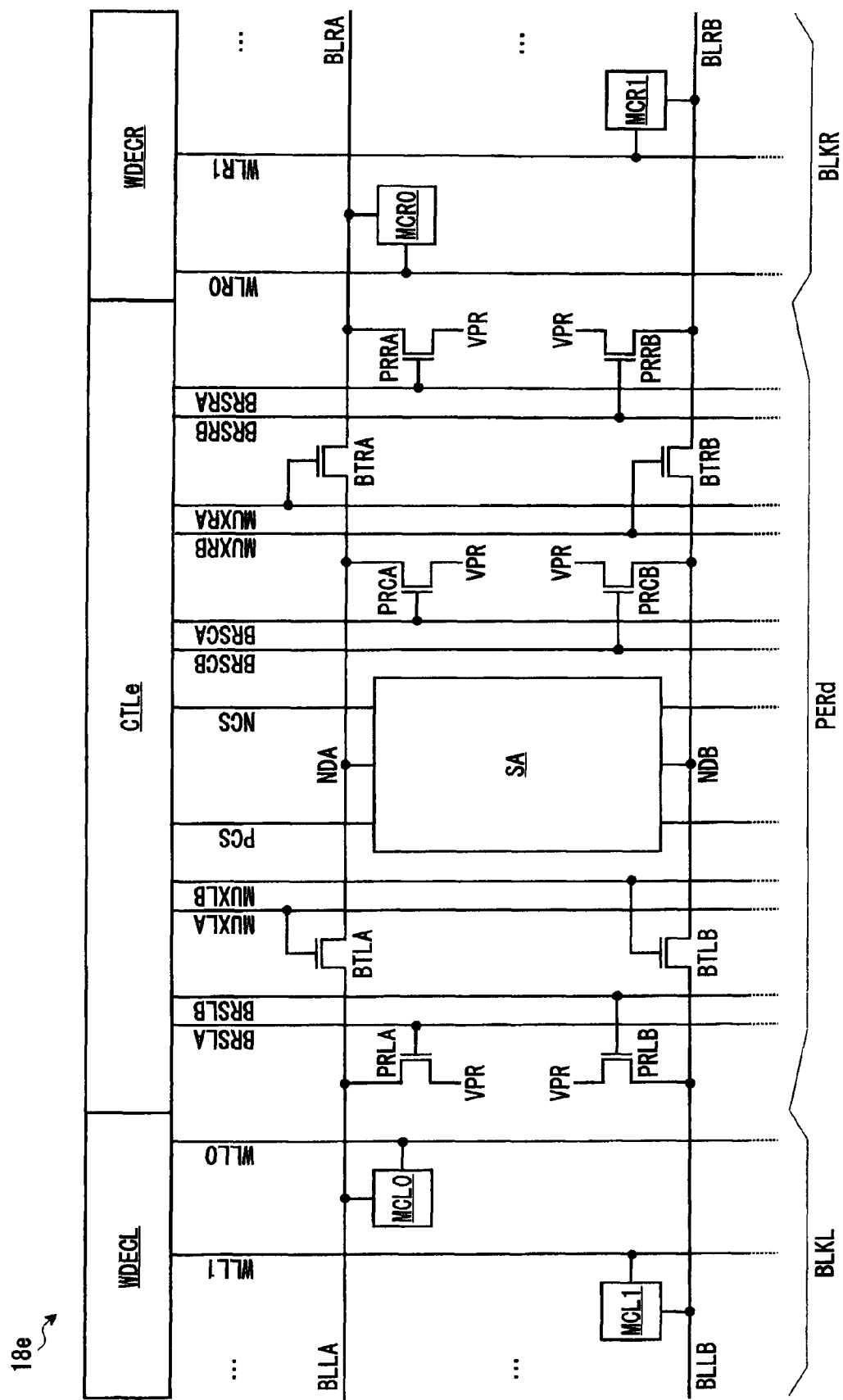
FIG. 13 shows a sixth embodiment.

FIG. 13 shows a sixth embodiment. In the description of the sixth embodiment, the same elements as the elements described in the first, second, fourth, and fifth embodiments will be denoted by the same reference numerals and symbols, and detailed description thereof will be omitted. A semiconductor memory of the sixth embodiment is structured such that a memory core 18e is provided in place of the memory core 18 of the semiconductor memory 10 of the first embodiment. For example, the semiconductor memory of the sixth embodiment realizes the memory 110 of the system LSI 100 shown in FIG. 3, similarly to the semiconductor memory 10 of the first embodiment. The memory core 18e of the sixth embodiment is structured such that a control circuit CTLe is provided in place of the control circuit CTLd of the memory core 18d of the fifth embodiment.

The control circuit CTLe of the sixth embodiment is the same as the control circuit CTLd of the fifth embodiment except that its output operation of switch control signals MUXLA, MUXLB, MUXRA, MUXRB is different. The control circuit CLe inactivates the switch control signals MUXLA, MUXLB, MUXRA, MUXRB to low level in response to the inactivation of a block control signal BLKE. In a state where a mode signal MD0 is set to low level, when one of row decode signals RAD corresponding to word lines WLL (WLR) is selected, the control circuit CTLe activates the switch control signals MUXLA, MUXLB (MUXRA, MUXRB) to high level in response to the activation of the block control signal BLKE.

On the other hand, in a state where the mode signal MD0 is set to high level, when one of the row decode signals RAD corresponding to the word lines WLL at whose intersection positions with bit lines BLLA (BLLB) memory cells MCL are disposed is selected, the control circuit CTLe activates the switch control signal MUXLA (MUXLB) to high level in response to the activation of the block control signal BLKE. Similarly, in the state where the mode signal MD0 is set to high level, when one of the row decode signals RAD corresponding to the word lines WLR at whose intersection positions with the bit lines BLRA (BLRB) memory cells MCR are disposed is selected, the control circuit CTLe activates the switch control signals MUXRA, MUXRB to high level in response to the activation of the block control signal BLKE.

Further, in a state where a mode signal MD1 in addition to the mode signal MD0 is set to high level, when one of the row decode signals RAD corresponding to the word lines WLL at whose intersection positions with the bit lines BLLA (BLLB) the memory cells MCL are disposed is selected, the control circuit CTLe inactivates the switch control signal MUXLA (MUXLB) to low level in response to the activation of a sense amplifier control signal SAE and keeps this state for a predetermined time. Similarly, in the state where the mode signal MD1 in addition to the mode signal MD0 is activated to high level, when one of the row decode signals RAD corresponding to the word lines WLR at whose intersection positions with the bit lines BLRA (BLRB) the memory cells MCR are disposed is selected, the control circuit CTLe inactivates the switch control signal MUXRA (MUXRB) to low level in response to the activation of the sense amplifier control signal SAE and keeps this state for a predetermined time. Here, when the switch control signal MUXLA (MUXLB, MUXRA, MUXRB) is inactivated to low level in response to the activation of the sense amplifier control signal SAE, the predetermined time is set so that the switch control signal MUXLA (MUXLB, MUXRA, MUXRB) is activated to high level after the activation of sense amplifier start signal lines PCS, NCS.

Figure 14:
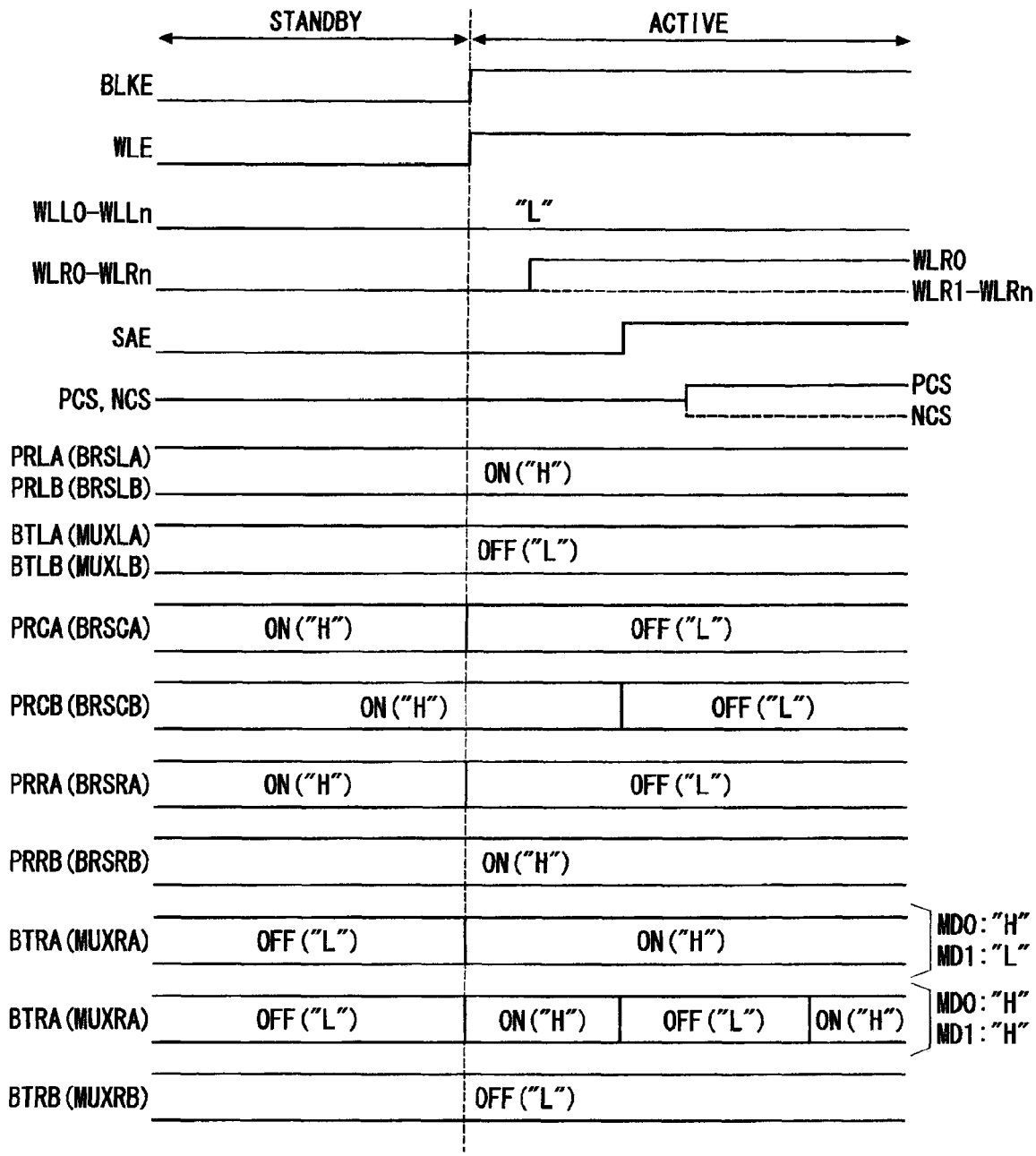
FIG. 14 shows is a timing chart of a semiconductor memory of the sixth embodiment.

FIG. 14 shows an operation example of the semiconductor memory of the sixth embodiment. This operation example shows operations when the row decode signal RAD corresponding to a word line WLR0 is selected when the semiconductor memory shifts from a standby state to an active state in the state where the mode signal MD0 is set to high level. Therefore, in this operation example, signals except the switch control signals MUXLA, MUXLB, MUXRA, MUXRB and circuits except bit line switches BTLA, BTLB, BTRA, BTRB operate in the same manner as in the operation example of the semiconductor memory of the fifth embodiment (FIG. 12).

In a standby period of the semiconductor memory, the switch control signals MUXLA, MUXLB, MUXRA, MUXRB are inactive at low level, so that the bit line switches BTLA, BTLB, BTRA, BTRB are off. Therefore, in the standby period of the semiconductor memory, the bit line pair BLLA, BLLB and the bit line pair BLRA, BLRB are separated from a sense amplifier SA (node pair NDA, NDB).

When a command signal CMD indicating an active command is input in this state, the switch control signal MUXRA is activated to high level in response to the activation of the block control signal BLKE since the row decode signal RAD corresponding to the word line WLR0 is selected, so that the bit line switch BTRA turns on. Consequently, the access-side bit line BLRA is coupled to the sense amplifier SA (access-side node NDA). Thereafter, the switch control signals MUXLA, MUXLB, MUXRA, MUXRB and the bit line switches BTLA, BTLB, BTRA, BTRB operate in the same manner as in the operation example of the semiconductor memory of the fifth embodiment (FIG. 12). Incidentally, when the mode signal MD0 is set to low level, the switch control signal MUXRB in addition to the switch control signal MUXRA is activated to high level in response to the activation of the block control signal BLKE, so that the bit line switch BTRB in addition to the bit line switch BTRA turns on.

The sixth embodiment described above can provide the same effects as those of the first, second, and fourth embodiments. In addition, in the sixth embodiment, the switch control signals MUXLA, MUXLB, MUXRA, MUXRB are inactive at low level in the standby period of the semiconductor memory. Therefore, when the power-conservation function is set valid, the sixth embodiment can decrease the number of times of the transition of the switch control signals MUXLA, MUXLB, MUXRA, MUXRB and consequently power consumption of the semiconductor memory can be further reduced, compared with the fifth embodiment.

Figure 15:
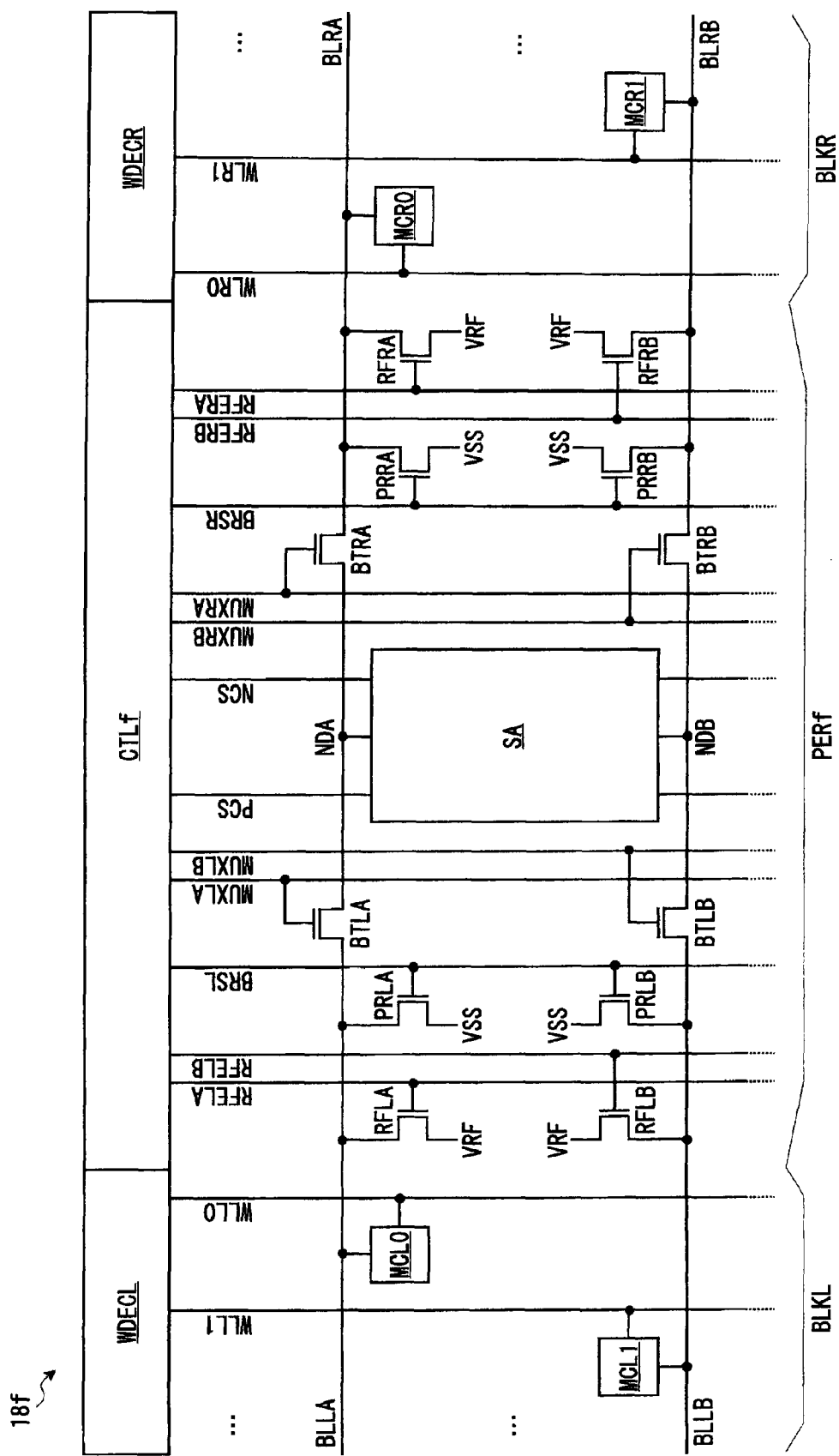
FIG. 15 shows a seventh embodiment.

FIG. 15 shows a seventh embodiment. In the description of the seventh embodiment, the same elements as the elements described in the first embodiment will be denoted by the same reference numerals and symbols, and detailed description thereof will be omitted. A semiconductor memory of the seventh embodiment is structured such that a memory core 18f is provided in place of the memory core 18 of the semiconductor memory 10 of the first embodiment. For example, the semiconductor memory of the seventh embodiment realizes the memory 110 of the system LSI 100 shown in FIG. 3, similarly to the semiconductor memory 10 of the first embodiment. The memory core 18f of the seventh embodiment is structured such that a control circuit CTLf and a peripheral circuit PERf are provided in place of the control circuit CTL and the peripheral circuit PER of the memory core 18 of the first embodiment.

The control circuit CTLf of the seventh embodiment is the same as the control circuit CTL of the first embodiment except that it outputs switch control signals MUXLA, MUXLB, MUXRA, MUXRB similarly to the control circuit CTLb of the third embodiment and outputs reference control signals RFELA, REFLB, REFRA, REFRB.

When one of row decode signals RAD corresponding to word lines WLL at whose intersection positions with bit lines BLLA (BLLB) memory cells MCL are disposed is selected, the control circuit CTLf activates the reference control signal RFELB (RFELA) to high level in response to the activation of a block control signal BLKE, and inactivates the reference control signal RFELB (RFELA) to low level in response to the activation of a sense amplifier control signal SAE. Similarly, when one of row decode signals RAD corresponding to word lines WLR at whose intersection positions with bit lines BLRA (BLRB) memory cells MCR are disposed is selected, the control circuit CTLf activates the reference control signal RFERB (RFERA) to high level in response to the activation of the block control signal BLKE and inactivates the reference control signal RFERB (RFERA) to low level in response to the activation of the sense amplifier control signal SAE.

The peripheral circuit PERf of the seventh embodiment is the same as the peripheral circuit PER of the first embodiment except that it has reference circuits RFLA, RFLB, RFRA, RFRB for each set of the bit line pair BLLA, BLLB and the bit line pair BLRA, BLRB, and a ground voltage line VSS is provided in place of the precharge voltage line VPR of the first embodiment. The reference circuit RFLA (RFLB, RFRA, RFRB) is formed by an nMOS transistor for coupling the bit line BLLA (BLLB, BLRA, BLRB) to a reference voltage line VRF. A gate of the nMOS transistor forming the reference circuit RFLA (RFLB, RFRA, RFRB) receives the reference control signal RELA (RFELB, RFERA, RFERB).

Figure 16:
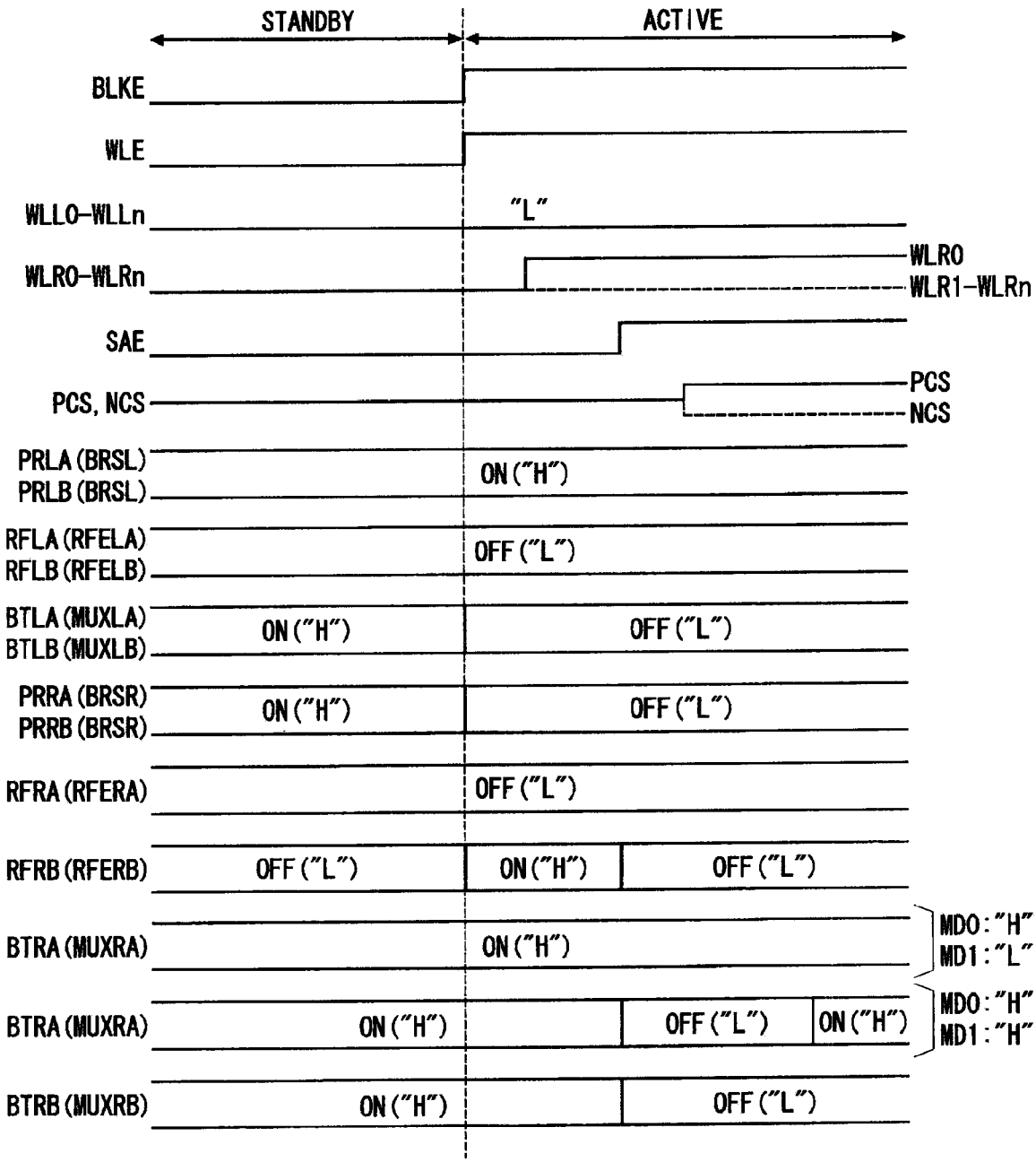
FIG. 16 shows a timing chart of a semiconductor memory of the seventh embodiment.

FIG. 16 shows an operation example of the semiconductor memory of the seventh embodiment. This operation example shows operations when the row decode signal RAD corresponding to a word line WLR0 is selected when the semiconductor memory shifts from a standby state to an active state in a state where a mode signal MD0 is set to high level. Therefore, in this operation example, signals except the switch control signals MUXLA, MUXLB, MUXRA, MUXRB and the reference control signals RFELA, RFELB, RFERA, RFERB, and circuits except bit line switches BTLA, BTLB, BTRA, BRRB and the reference circuits RFLA, RFLB, RFRA, RFRB operate in the same manner as in the operation example of the semiconductor memory of the first embodiment (FIG. 4). The switch control signals MUXLA, MUXLB, MUXRA, MUXRB and the bit line switches BTLA, BTLB, BTRA, BTRB operate in the same manner as in the operation example of the semiconductor memory of the third embodiment (FIG. 8).

In a standby period of the semiconductor memory, the reference control signals RFELA, RFELB, RFERA, RFERB are inactive at low level, so that the reference circuits RFLA, RFLB, RFRA, RFRB are off. Therefore, in the standby period of the semiconductor memory, the bit line pair BLLA, BLLB and the bit line pair BLRA, BLRB are separated from the reference voltage line VRF.

When a command signal CMD indicating an active command is input in this state, the reference control signal RFERB is activated to high level in response to the activation of the block control signal BLKE since the row decode signal RAD corresponding to the word line WLR0 is selected, so that the reference circuit RFRB turns on. Consequently, the non-access-side bit line BLRB is coupled to the reference voltage line VRF. At this time, the bit line switch BRTB is on, so that the non-access-side bit line BLRB is coupled to a non-access-side node NDB. Therefore, the non-access-side bit line BLRB is coupled to the reference voltage line VRF while coupled to the non-access-side node NDB. Thereafter, the reference control signal RFECB is inactivated to low level in response to the activation of a sense amplifier control signal SAE, so that the reference circuit RFRB turns off. Consequently, the non-access-side bit line BLRB is separated from the reference voltage line VRF.

The seventh embodiment described above can provide the same effects as those of the first embodiment even when reference level and precharge level are different and the reference circuits RFLA, RFLB, RFRA, RFRB for coupling the bit lines BLLA, BLLB, BLRA, BLRB to the reference voltage line VRF are provided.

Figure 17:
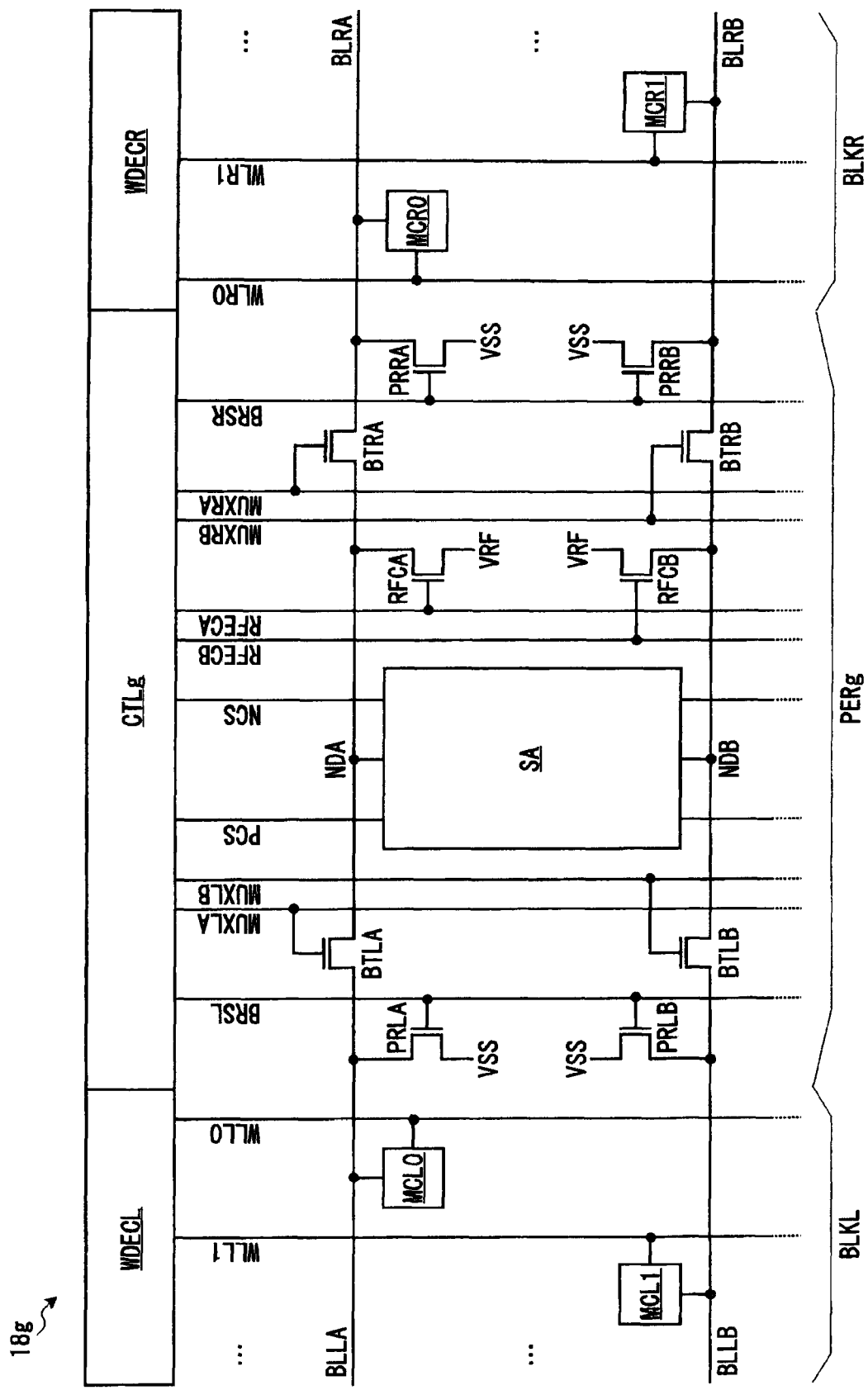
FIG. 17 shows an eighth embodiment.

FIG. 17 shows an eighth embodiment. In the description of the eighth embodiment, the same elements as the elements described in the first embodiment will be denoted by the same reference numerals and symbols, and detailed description thereof will be omitted. A semiconductor memory of the eighth embodiment is structured such that a memory core 18g is provided in place of the memory core 18 of the semiconductor memory 10 of the first embodiment. For example, the semiconductor memory of the eighth embodiment realizes the memory 110 of the system LSI 100 shown in FIG. 3, similarly to the semiconductor memory 10 of the first embodiment. The memory core 18g of the eighth embodiment is structured such that a control circuit CTLg and a peripheral circuit PERg are provided in place of the control circuit CTL and the peripheral circuit PER of the memory core 18 of the first embodiment.

The control circuit CTLg of the eighth embodiment is the same as the control circuit CTL of the first embodiment except that it outputs reference control signals RFECA, RFECB. When one of row decode signals RAD corresponding to word lines WLL (WLR) at whose intersection positions with bit lines BLLA (BLRA) memory cells MCL (MCR) are disposed is selected, the control circuit CTLg activates the reference control signal RFECB (RFECA) to high level in response to the activation of a block control signal BLKE and inactivates the reference control signal RFECB (RFECA) to low level in response to the activation of a sense amplifier control signal SAE. Similarly, when one of row decode signals RAD corresponding to word lines WLL (WLR) at whose intersection positions with bit lines BLLB (BLRB) memory cells MCL (MCR) are disposed is selected, the control circuit CTLg activates the reference control signal RFECA (RFECB) to high level in response to the activation of the block control signal BLKE, and inactivates the reference control signal RFECA (RFECB) to low level in response to the activation of the sense amplifier control signal SAE. Therefore, the reference control signal RFECA corresponds to an AND signal of the reference control signals RFELA, RFERA of the seventh embodiment, and the reference control signal RFECB corresponds to an AND signal of the reference control signals RFELB, RFERB of the seventh embodiment.

The peripheral circuit PERg of the eighth embodiment is the same as the peripheral circuit PER of the first embodiment except that it has reference circuits RFCA, RFCB for each set of the bit line pair BLLA, BLLB and the bit line pair BLRA, BLRB, and a ground voltage line VSS is provided in place of the precharge voltage line VPR of the first embodiment. The reference circuit RFCA (RFCB) is formed by an nMOS transistor for coupling a node NDA (NDB) to a reference voltage line VRF. A gate of the nMOS transistor forming the reference circuit RFCA (RFCB) receives the reference control signal RFECA (RFECB).

Figure 18:
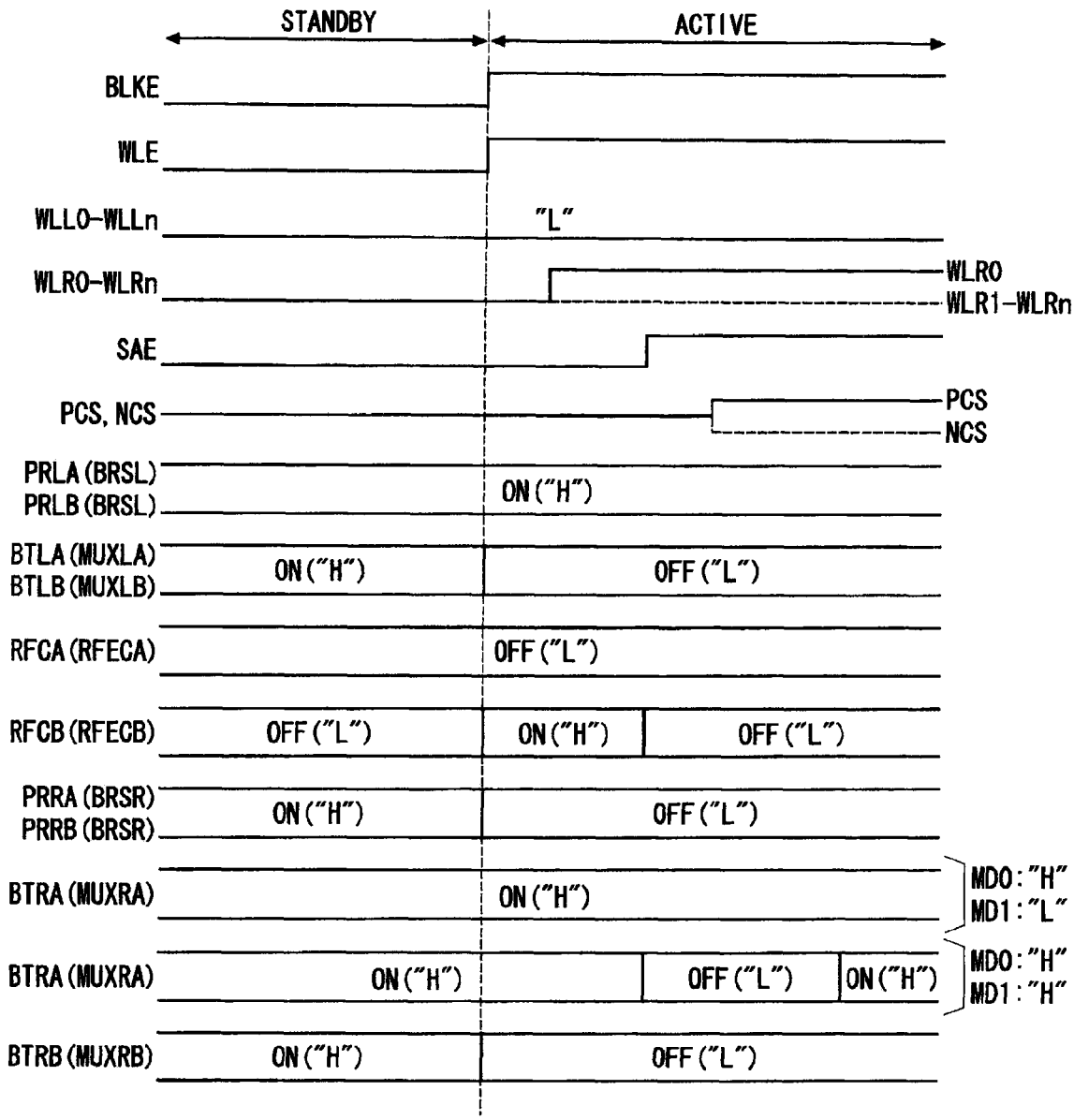
FIG. 18 shows a timing chart a semiconductor memory of the eighth embodiment.

FIG. 18 shows an operation example of the semiconductor memory of the eighth embodiment. This operation example shows operations when the row decode signal RAD corresponding to a word line WLR0 is selected when the semiconductor memory shifts from a standby state to an active state in a state where a mode signal MD0 is set to high level. Therefore, in this operation example, signals except the reference control signals RFECA, RFECB and circuits except the reference circuits RFCA, RFCB operate in the same manner as in the operation example of the semiconductor memory of the first embodiment (FIG. 4).

In a standby period of the semiconductor memory, the reference control signals RFECA, RFECB are inactive at low level, so that the reference circuits RFCA, RFCB are off. Therefore, in the standby period of the semiconductor memory, the node pair NDA, NDB is separated from the reference voltage line VRF.

When a command signal CMD indicating an active command is input in this state, the reference control signal RFECB is activated to high level in response to the activation of the block control signal BLKE since the row decode signal RAD corresponding to the word line WLR0 is selected, so that the reference circuit RFCB turns on. Consequently, the non-access-side node NDB is coupled to the reference voltage line VRF. Thereafter, the reference control signal RFECB is inactivated to low level in response to the activation of the sense amplifier control signal SAE, so that the reference circuit RFCB turns off. Consequently, the non-access-side node NDB is separated from the reference voltage line VRF.

The eighth embodiment described above can provide the same effects as those of the first embodiment even when reference level and precharge level are different and the reference circuits RFCA, RFCB for coupling the nodes NDA, NDB to the reference voltage line VRF are provided.

Figure 19:
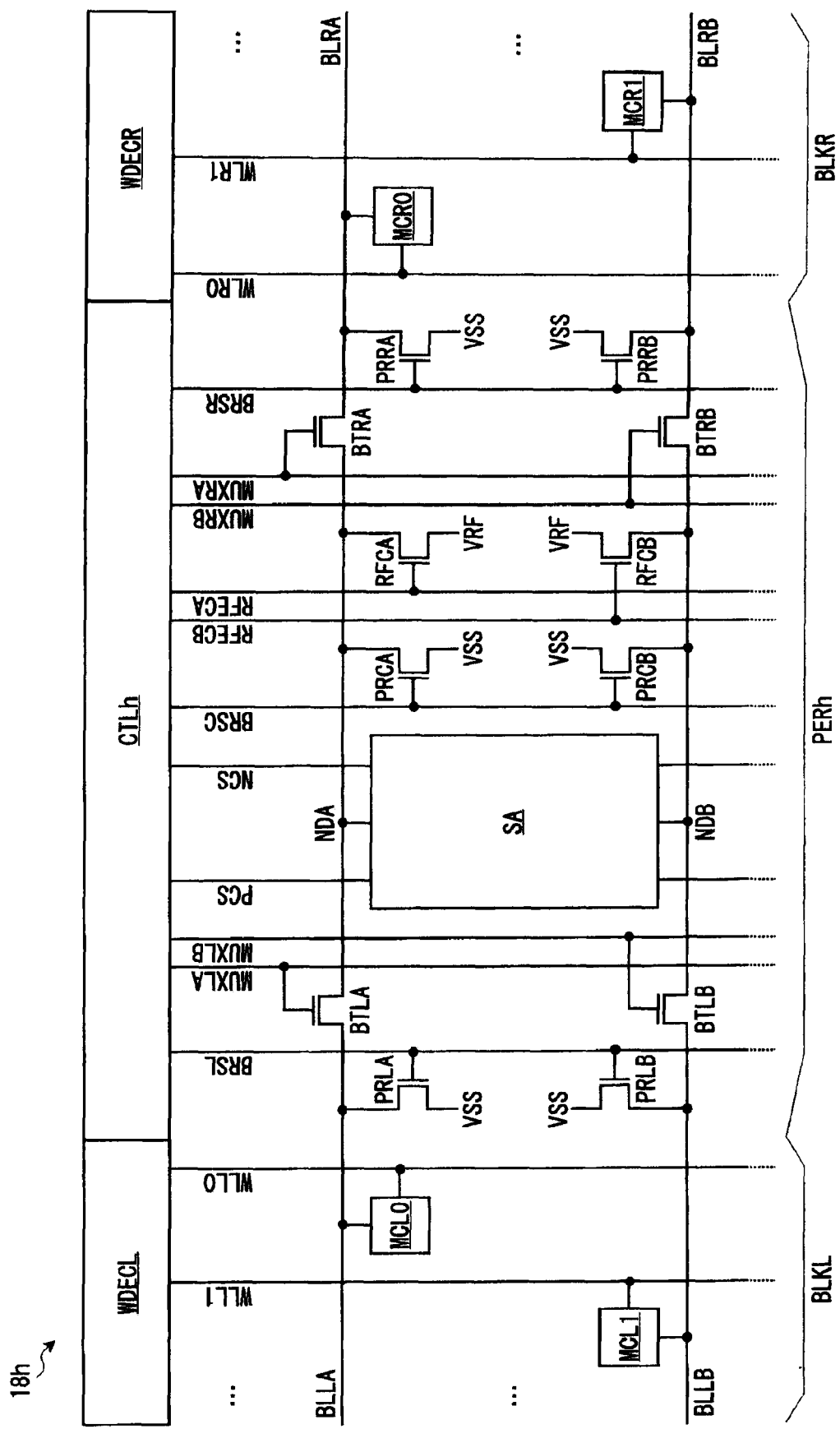
FIG. 19 shows a ninth embodiment.

FIG. 19 shows a ninth embodiment. In the description of the ninth embodiment, the same elements as the elements described in the first and eighth embodiments will be denoted by the same reference numerals and symbols, and detailed description thereof will be omitted. A semiconductor memory of the ninth embodiment is structured such that a memory core 18h is provided in place of the memory core 18 of the semiconductor memory 10 of the first embodiment. For example, the semiconductor memory of the ninth embodiment realizes the memory 110 of the system LSI 100 shown in FIG. 3, similarly to the semiconductor memory 10 of the first embodiment. The memory core 18h of the ninth embodiment is structured such that a control circuit CTLh and a peripheral circuit PERh are provided in place of the control circuit CTL and the peripheral circuit PER of the memory core 18 of the first embodiment.

The control circuit CTLh of the ninth embodiment is the same as the control circuit CTLg of the eighth embodiment except that it outputs switch control signals MUXLA, MUXLB, MUXRA, MUXRB similarly to the control circuit CTLe of the sixth embodiment and outputs a precharge control signal BRSC. The control circuit CTLh activates the precharge control signal BRSC to high level in response to the inactivation of a block control signal BLKE, and inactivates the precharge control signal BRSC to low level in response to the activation of the block control signal BLKE. Therefore, the precharge control signal BRSC corresponds to an AND signal of the precharge control signals BRSL, BRSR.

The peripheral circuit PERh of the ninth embodiment is the same as the peripheral circuit PERg of the eighth embodiment except that it has precharge circuits PRCA, PRCB for each set of a bit line pair BLLA, BLLB and a bit line pair BLRA, BLRB. The precharge circuit PRCA (PRCB) is formed by an nMOS transistor for coupling a node NDA (NDB) to a ground voltage line VSS. A gate of the nMOS transistor forming the precharge circuit PRCA (PRCB) receives the precharge control signal BRSC.

Figure 20:
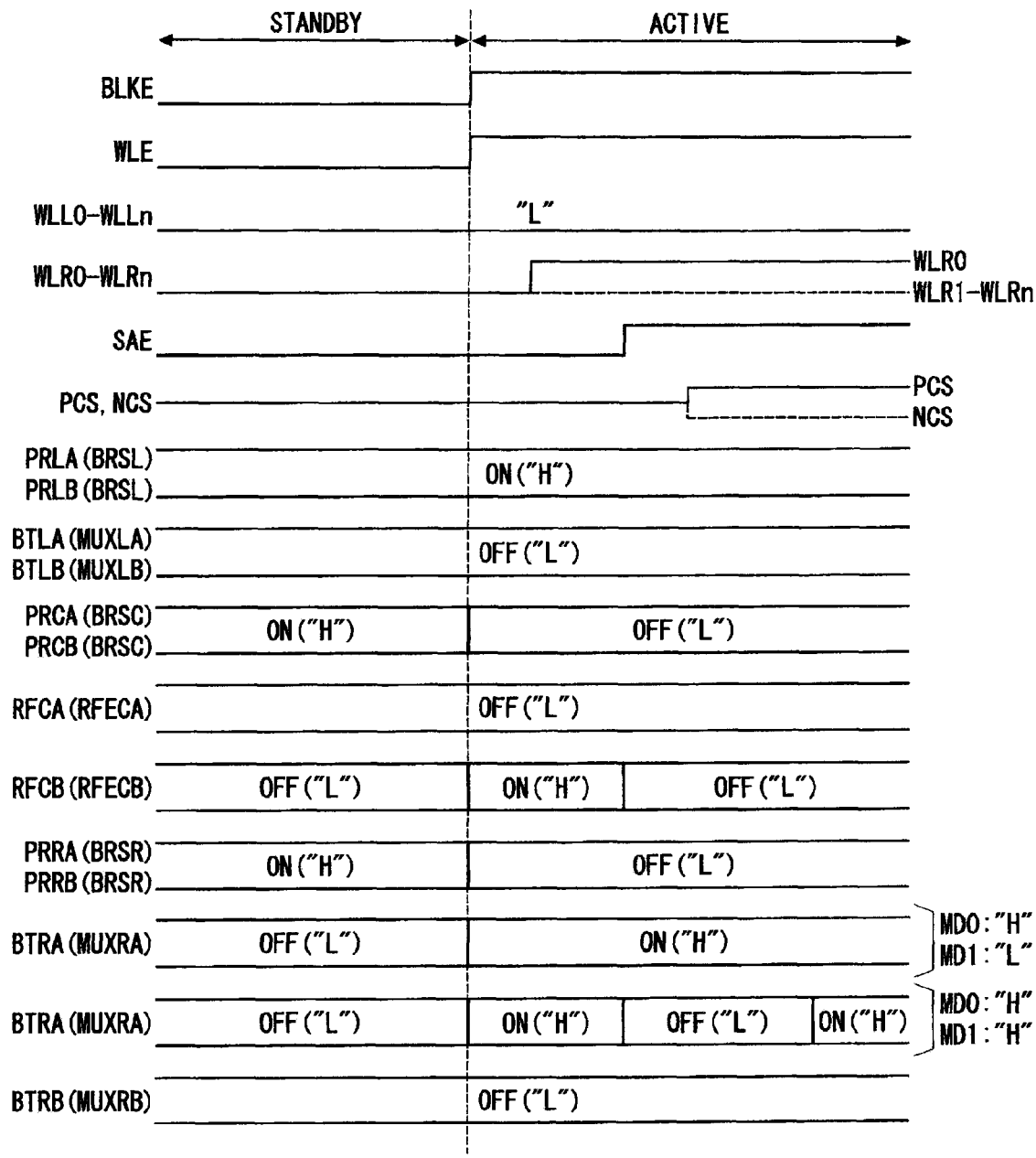
FIG. 20 shows a timing chart a semiconductor memory of the ninth embodiment.

FIG. 20 shows an operation example of the semiconductor memory of the ninth embodiment. This operation example shows operations when a row decode signal RAD corresponding to a word line WLR0 is selected when the semiconductor memory shifts from a standby state to an active state in a state where a mode signal MD0 is set to high level. Therefore, in this operation example, signals except the switch control signals MUXLA, MUXLB, MUXRA, MUXRB and the precharge control signal BRSC and circuits except bit line switches BTLA, BTLB, BTRA, BTRB and the precharge circuits PRCA, PRCB operate in the same manner as in the operation example of the semiconductor memory of the eighth embodiment (FIG. 18). The switch control signals MUXLA, MUXLB, MUXRA, MUXRB and the bit line switches BTLA, BTLB, BTRA, BTRB operate in the same manner as in the operation example of the semiconductor memory of the sixth embodiment (FIG. 14).

In a standby period of the semiconductor memory, the precharge control signal BRSC is active at high level, so that the precharge circuits PRCA, PRCB are on. Further, the switch control signals MUXLA, MUXLB, MUXRA, MUXRB are inactive at low level, so that the bit line switches BTLA, BTLB, BTRA, BTRB are off. Therefore, in the standby period of the semiconductor memory, a node pair NDA, NDB is coupled to the ground voltage line VSS and the bit line pair BLLA, BLLB and the bit line pair BLRA, BLRB are separated from a sense amplifier SA (node pair NDA, NDB).

When a command signal CMD indicating an active command is input in this state, the precharge control signal BRSC is inactivated to low level in response to the activation of the block control signal BLKE, so that the precharge circuits PRCA, PRCB turn off. Consequently, the node pair NDA, NDB is separated from the ground voltage line VSS. Further, since the row decode signal RAD corresponding to the word line WLR0 is selected, the switch control signal MUXRA is activated to high level in response to the activation of the block control signal BLKE, so that the bit line switch BTRA turns on. Consequently, the access-side bit line BLRA is coupled to the sense amplifier SA (access-side node NDA).

The ninth embodiment described above can provide the same effects as those of the first and eighth embodiments. In addition, in the ninth embodiment as in the sixth embodiment, the switch control signals MUXLA, MUXLB, MUXRA, MUXRB are inactive at low level in the standby period of the semiconductor memory. Therefore, the ninth embodiment can decrease the number of times of the transition of the switch control signals MUXLA, MUXLB, MUXRA, MUXRB and further reduce power consumption of the semiconductor memory, compared with the eighth embodiment, when the power-conservation function is set valid.

The first to ninth embodiments describe the examples where the invalidity/validity of the power-conservation function and the operation mode are decided according to the set value of the mode register of the mode setting circuit 15, but for example, the invalidity/validity of the power-conservation function and the operation mode may be decided according to a logic value of a control signal supplied via an external terminal, fusion/nonfusion of a fuse circuit, or the structure of a metal layer of the semiconductor memory.

Further, the seventh to ninth embodiments describe the examples where the ground voltage VSS is used as the precharge level, but for example, when power supply voltage VII, bit line low level voltage VBLL, or bit line high level voltage VBLH is used as the precharge level, the same effects can be obtained.

Figure 21:
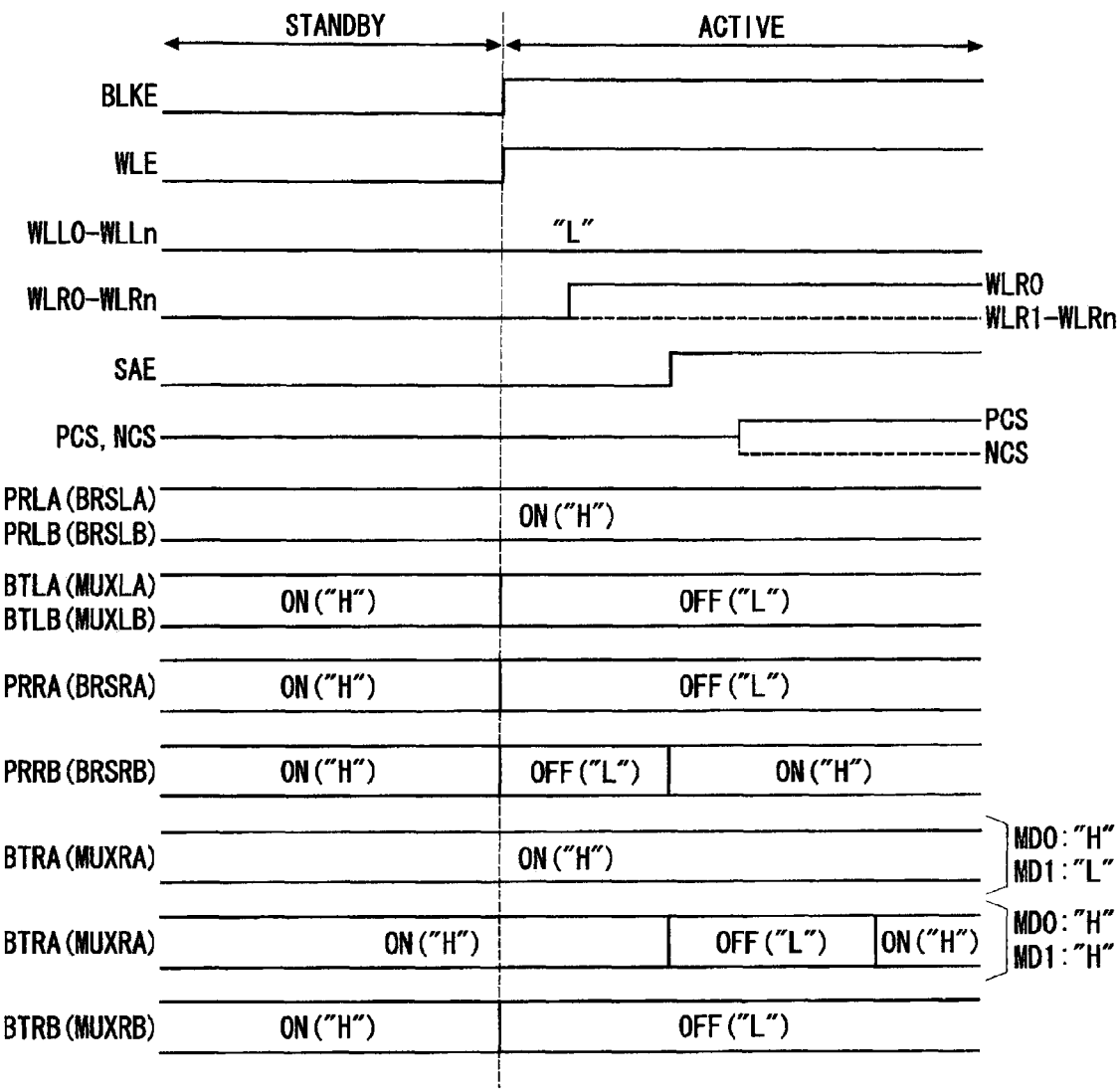
FIG. 21 shows a timing chart of a modification example of the second embodiment.
Figure 22:
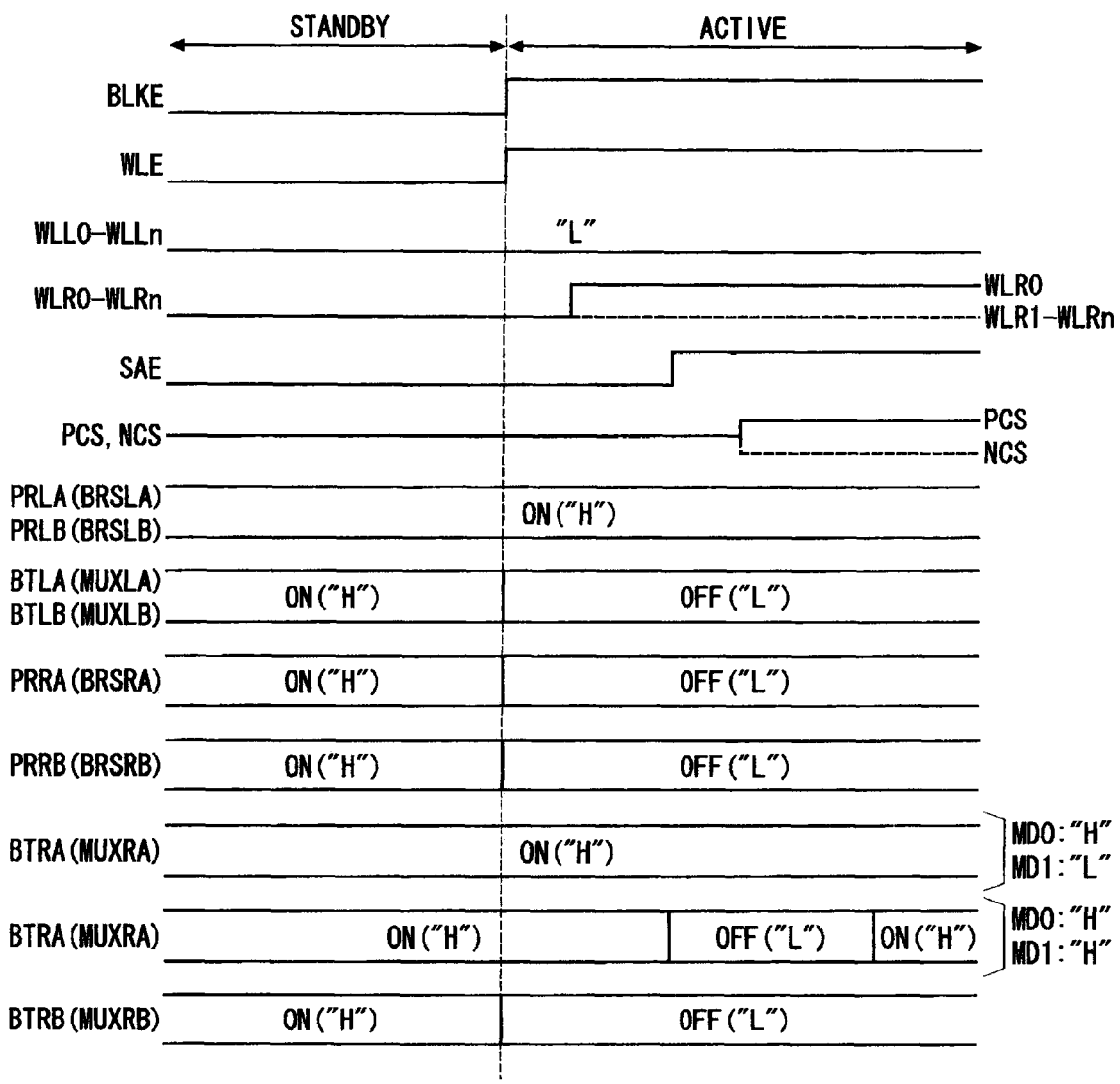
FIG. 22 shows a timing chart of another modification example of the second embodiment.

Further, the second embodiment describes the example where the precharge circuit (the precharge circuit PRRB in FIG. 6) which is coupled to the non-access side of the bit line pair BLLA, BLLB (BLRA, BLRB) is kept on even after the activation of the block control signal BLKE, but for example, as shown in FIG. 21, the precharge circuit (precharge circuit PRRB in FIG. 21) which is coupled to the non-access side of the bit line pair BLLA, BLLB (BLRA, BLRB) may turn off in response to the activation of the block control signal BLKE and turn on in response to the activation of the sense amplifier control signal SAE. Alternatively, as shown in FIG. 22, the precharge circuit (precharge circuit PRRB in FIG. 22) which is coupled to the non-access side of the bit line pair BLLA, BLLB (BLRA, BLRB) may turn off in response to the activation of the block control signal BLKE.

It is a proposition of the aforementioned embodiment to realize a reduction in power consumption of a semiconductor memory by reducing current consumption of a sense amplifier to a minimum.

According to an aspect of the embodiment, a semiconductor memory mounted on a system such as a portable electronic device includes a plurality of memory cells, a word line driving circuit, a first precharge circuit, a sense amplifier, and a switch circuit. The plural memory cells are provided at positions where a plurality of word lines and a bit line pair intersect with each other, respectively. The word line driving circuit activates one of the plural word lines in accordance with transition from a standby period to an active period. The first precharge circuit couples the bit line pair to a precharge voltage line in the standby period and separates at least an access side of the bit line pair from the precharge voltage line in accordance with operation start of the word line driving circuit. The sense amplifier amplifies a voltage difference of a node pair corresponding to the bit line pair after the operation start of the word line driving circuit. The switch circuit is provided between the bit line pair and the node pair. The switch circuit has coupled the access side of the bit line pair to an access side of the node pair at an instant of the operation start of the word line driving circuit, and has separated a non-access side of the bit line pair from a non-access side of the node pair at an instant of operation start of the sense amplifier. In the semiconductor memory thus structured, the non-access side of the bit line pair is separated from the non-access side of the node pair (that is, the sense amplifier) before the operation start of the sense amplifier (that is, independently of the amplification operation of the sense amplifier), and therefore, current consumption of the sense amplifier can be reduced to a minimum, which can greatly contribute to a reduction in power consumption of the semiconductor memory.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory comprising:
   a plurality of memory cells provided at positions where a plurality of word lines and a bit line pair intersect with each other, respectively;
   a word line driving circuit activating one of the plural word lines in accordance with transition from a standby period to an active period;
   a first precharge circuit coupling the bit line pair to a precharge voltage line in the standby period, and separating at least an access side of the bit line pair from the precharge voltage line in accordance with operation start of the word line driving circuit;
   a sense amplifier amplifying a voltage difference of a node pair corresponding to the bit line pair after the operation start of the word line driving circuit; and
   a switch circuit provided between the bit line pair and the node pair,
   wherein the switch circuit includes a first switch circuit and a second switch circuit,
   wherein the first switch circuit couples the access side of the bit line pair to an access side of the node pair, based on a first control signal, at a timing of the operation start of the word line driving circuit, and the second switch circuit separates a non-access side of the bit line pair from a non-access side of the node pair, based on a second control signal, at a timing of operation start of the sense amplifier.

2. The semiconductor memory according to claim 1, wherein the switch circuit has coupled the non-access side of the bit line pair to the non-access side of the node pair at the timing of the operation start of the sense amplifier when power-conservation function information indicates function invalidity, and the switch circuit has separated the non-access side of the bit line pair from the non-access side of the node pair at the timing of the operation start of the sense amplifier when the power-conservation function information indicates function validity.

3. The semiconductor memory according to claim 1, wherein the switch circuit temporarily separates the access side of the bit line pair from the access side of the node pair in time with the operation start of the sense amplifier after the operation start of the word line driving circuit.

4. The semiconductor memory according to claim 1, wherein the first precharge circuit separates only the access side of the bit line pair from the precharge voltage line in accordance with the operation start of the word line driving circuit.

5. The semiconductor memory according to claim 1, further comprising
a reference circuit which couples the non-access side of the bit line pair to a reference voltage line in accordance with the operation start of the word line driving circuit, and separates the non-access side of the bit line pair from the reference voltage line in accordance with the operation start of the sense amplifier,
wherein the first precharge circuit separates the bit line pair from the precharge voltage line in accordance with the operation start of the word line driving circuit; and
the switch circuit separates the non-access side of the bit line pair from the non-access side of the node pair in accordance with the operation start of the sense amplifier.

6. The semiconductor memory according to claim 1, further comprising
a reference circuit which couples the non-access side of the node pair to a reference voltage line in accordance with the operation start of the word line driving circuit, and separates the non-access side of the node pair from the reference voltage line in accordance with the operation start of the sense amplifier,
wherein: the first precharge circuit separates the bit line pair from the precharge voltage line in accordance with the operation start of the word line driving circuit; and
the switch circuit separates the non-access side of the bit line pair from the non-access side of the node pair in accordance with the operation start of the word line driving circuit.

7. The semiconductor memory according to claim 1, further comprising
a second precharge circuit which couples the node pair to the precharge voltage line in the standby period, separates the access side of the node pair from the precharge voltage line in accordance with the operation start of the word line driving circuit, and separates the non-access side of the node pair from the precharge voltage line in accordance with the operation start of the sense amplifier.

8. The semiconductor memory according to claim 3, wherein the switch circuit continuously couples the access side of the bit line pair to the access side of the node pair after the operation start of the word line driving circuit in a first mode, and the switch circuit temporarily separates the access side of the bit line pair from the access side of the node pair in time with the operation start of the sense amplifier after the operation start of the word line driving circuit in a second mode.

9. The semiconductor memory according to claim 4, wherein the switch circuit separates the non-access side of the bit line pair from the non-access side of the node pair in accordance with the operation start of the sense amplifier.

10. The semiconductor memory according to claim 4, further comprising
a second precharge circuit which couples the node pair to the precharge voltage line in the standby period, separates the access side of the node pair from the precharge voltage line in accordance with the operation start of the word line driving circuit, and separates the non-access side of the node pair from the precharge voltage line in accordance with the operation start of the sense amplifier.

11. The semiconductor memory according to claim 10, wherein the switch circuit separates the bit line pair from the node pair in the standby period, and couples the access side of the bit line pair to the access side of the node pair in accordance with the operation start of the word line driving circuit.

12. The semiconductor memory according to claim 6, further comprising
a second precharge circuit which couples the node pair to the precharge voltage line in the standby period, and separates the node pair from the precharge voltage line in accordance with the operation start of the word line driving circuit,
wherein the switch circuit separates the bit line pair from the node pair in the standby period, and couples the access side of the bit line to the access side of the node pair in accordance with the operation start of the word line driving circuit.

13. The semiconductor memory according to claim 7, wherein the switch circuit separates the bit line pair from the node pair in the standby period, and couples the access side of the bit line pair to the access side of the node pair in accordance with the operation start of the word line driving circuit.

14. A system comprising a semiconductor memory,
wherein the semiconductor memory comprises:
a plurality of memory cells provided at positions where a plurality of word lines and a bit line pair intersect with each other, respectively;
a word line driving circuit activating one of the plural word lines in accordance with transition from a standby period to an active period;
a first precharge circuit coupling the bit line pair to a precharge voltage line in the standby period, and separating at least an access side of the bit line pair from the precharge voltage line in accordance with operation start of the word line driving circuit;
a sense amplifier amplifying a voltage difference of a node pair corresponding to the bit line pair after the operation start of the word line driving circuit; and
a switch circuit provided between the bit line pair and the node pair,
wherein the switch circuit includes a first switch circuit and a second switch circuit,
wherein the first switch circuit couples the access side of the bit line pair to an access side of the node pair, based on a first control signal, at a timing of the operation start of the word line driving circuit, and the second switch circuit separates a non-access side of the bit line pair from a non-access side of the node pair, based on a second control signal, at a timing of operation start of the sense amplifier.

15. The system according to claim 14, wherein the switch circuit has coupled the non-access side of the bit line pair to the non-access side of the node pair at the timing of the operation start of the sense amplifier when power-conservation function information indicates function invalidity, and the switch circuit has separated the non-access side of the bit line pair from the non-access side of the node pair at the timing of the operation start of the sense amplifier when the power-conservation function information indicates function validity.

16. The system according to claim 14, wherein the switch circuit temporarily separates the access side of the bit line pair from the access side of the node pair in time with the operation start of the sense amplifier after the operation start of the word line driving circuit.

17. The system according to claim 14, wherein the first precharge circuit separates only the access side of the bit line pair from the precharge voltage line in accordance with the operation start of the word line driving circuit.

18. The system according to claim 14, wherein:

the semiconductor memory further comprises a reference circuit which couples the non-access side of the bit line pair to a reference voltage line in accordance with the operation start of the word line driving circuit, and separates the non-access side of the bit line pair from the reference voltage line in accordance with the operation start of the sense amplifier;

the first precharge circuit separates the bit line pair from the precharge voltage line in accordance with the operation start of the word line driving circuit; and the switch circuit separates the non-access side of the bit line pair from the non-access side of the node pair in accordance with the operation start of the sense amplifier.

19. The system according to claim 14, wherein:

the semiconductor memory comprises a reference circuit which couples the non-access side of the node pair to a reference voltage line in accordance with the operation start of the word line driving circuit, and separates the non-access side of the node pair from the reference voltage line in accordance with the operation start of the sense amplifier;

the first precharge circuit separates the bit line pair from the precharge voltage line in accordance with the operation start of the word line driving circuit; and the switch circuit separates the non-access side of the bit line pair from the non-access side of the node pair in accordance with the operation start of the word line driving circuit.

20. The system according to claim 14, wherein the semiconductor memory comprises a second precharge circuit which couples the node pair to the precharge voltage line in the standby period, separates the access side of the node pair from the precharge voltage line in accordance with the operation start of the word line driving circuit, and separates the non-access side of the node pair from the precharge voltage line in accordance with the operation start of the sense amplifier.

* * * * *